United States Patent
Subramanian et al.

(10) Patent No.: US 10,559,348 B2
(45) Date of Patent: Feb. 11, 2020

(54) SYSTEM, APPARATUS AND METHOD FOR SIMULTANEOUS READ AND PRECHARGE OF A MEMORY

(71) Applicant: Intel Corporation, Santa Clara, CA (US)

(72) Inventors: Lavanya Subramanian, San Jose, CA (US); Kaushik Vaidyanathan, Santa Clara, CA (US); Anant Nori, Bangalore (IN); Sreenivas Subramoney, Bangalore (IN); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/980,813

(22) Filed: May 16, 2018

(65) Prior Publication Data

US 2019/0355411 A1 Nov. 21, 2019

(51) Int. Cl.
*G11C 7/00* (2006.01)
*G11C 11/4094* (2006.01)
*G06F 13/16* (2006.01)
*G11C 11/4093* (2006.01)
*G11C 11/4091* (2006.01)

(52) U.S. Cl.
CPC ...... *G11C 11/4094* (2013.01); *G06F 13/1673* (2013.01); *G11C 11/4091* (2013.01); *G11C 11/4093* (2013.01)

(58) Field of Classification Search
CPC ............ G11C 11/4094; G11C 11/4091; G11C 11/4093; G06F 13/1673
See application file for complete search history.

(56) References Cited

U.S. PATENT DOCUMENTS

| | | | |
|---|---|---|---|
| 6,799,241 B2 | 9/2004 | Kahn et al. | |
| 6,976,122 B1 | 12/2005 | Sander et al. | |
| 2015/0155015 A1* | 6/2015 | Park | G11C 7/12 365/189.11 |
| 2018/0122442 A1* | 5/2018 | Son | G11C 7/065 |
| 2018/0315466 A1* | 11/2018 | Derner | G11C 11/4091 |

OTHER PUBLICATIONS

M. Awasthi, et al., "Prediction based DRAM row-buffer management in the many-core era," 2011, 2 pages.
(Continued)

*Primary Examiner* — Toan K Le
(74) *Attorney, Agent, or Firm* — Trop, Pruner & Hu, P.C.

(57) ABSTRACT

In one embodiment, an apparatus includes a memory array having a plurality of memory cells, a plurality of bitlines coupled to the plurality of memory cells, and a plurality of wordlines coupled to the plurality of memory cells. The memory array may further include a sense amplifier circuit to sense and amplify a value stored in a memory cell of the plurality of memory cells. The sense amplifier circuit may include: a buffer circuit to store the value, the buffer circuit coupled between a first internal node of the sense amplifier circuit and a second internal node of the sense amplifier circuit; and an equalization circuit to equalize the first internal node and the second internal node while the sense amplifier circuit is decoupled from the memory array. Other embodiments are described and claimed.

20 Claims, 20 Drawing Sheets

(56) References Cited

OTHER PUBLICATIONS

M. Khurshid, et al., "Stride and global history based DRAM page management," 2012, 5 pages.
S. O, et al., "Row-buffer decoupling: A case for low-latency DRAM microarchitecture," 2014, 12 pages.
D. Lee, et al., "Design-Induced Latency Variation in Modern DRAM Chips: Characterization, Analysis, and Latency Reduction Mechanisms," Jun. 2017, 36 pages.
R. Kraus, "Analysis and reduction of sense-amplifier offset," in Journal of Solid State Circuits, vol. 24, Aug. 1989, 6 pages.

* cited by examiner

SYSTEM, APPARATUS AND METHOD FOR SIMULTANEOUS READ AND PRECHARGE OF A MEMORY

TECHNICAL FIELD

Embodiments relate to memory architectures and control.

BACKGROUND

Typical computing systems include one or more processors and one or more memories coupled thereto. System memory is often formed of dynamic random access memory (DRAM). Memory access to a DRAM can be a high bottleneck in such systems. The DRAM memory access latency is high due to DRAM memory organization. In order to access a piece of data from DRAM, bitlines are first precharged to a certain voltage level. An activate command is then issued to sense data stored in a row and hold it in sense amplifier/row buffer circuitry. The sense amplifier performs the role of sensing the charge stored in DRAM capacitive bitcells, amplifying it and then holding it. This process is called row activation. Subsequent requests to the same row (row buffer hits) can be served from the sense amplifiers and do not encounter precharge and activation latencies. Before another access to a different row (row buffer miss) can be served, the bitlines are again precharged. Delaying this precharge until another activate command to a different row arrives enables more row buffer hits. However, these row buffer hits come at the cost of delaying the incoming activation until the precharge completes. On the other hand, precharging immediately after an access to a row is completed avoids delaying future activations, but compromises row buffer locality.

Memory controllers trade off between these two extremes by holding idle rows open for a certain time after the last request to a row is seen or until the next activation, whichever comes earlier. Despite employing such a policy, inefficiencies still exist.

DETAILED DESCRIPTION

In various embodiments, a memory architecture is provided to enable accesses to an activated group of memory cells to occur concurrently with a precharge to bitlines associated with such memory cells. Stated another way, a memory architecture in accordance with an embodiment may provide for simultaneous read access to a group of memory cells while performing a bitline precharge operation. To effect operation of a memory architecture as described herein, a memory controller coupled to the memory may be configured to provide appropriate commands to the memory to enable the concurrent access and precharge, as well as to dynamically control an open duration for a given group of memory cells based at least in part on access patterns, as will be described herein. As used herein, an open duration is a length of time in which read/write data remains accessible in a buffer for the memory cells and a sense amplifier for this buffer is enabled.

A memory as described herein may be configured for a simultaneous read and precharge (SRP) operation, in which a precharge operation may overlap with read accesses. Stated another way, with SRP the precharge of bitlines may occur concurrently with read accesses that are served from a sense amplifier of the memory. In contrast, conventional initiation of a precharge prevents further read access. Instead, in embodiments a precharge can be issued while the contents of the previous row are still held in the sense amplifiers. Such operation may reduce memory access latency for multiple different kinds of memory access scenarios. In addition, SRP may reduce activation latency via a hardware mechanism to enable sense amplifiers to be precharged during a charge sharing phase of an activation operation. Additional activation latency reduction may be realized by providing an isolation mechanism (for the sense amplifiers) having an appropriate sizing and biasing.

Still further with an embodiment herein, write latency may be reduced by not issuing a precharge operation to a group of memory cells (e.g., a row) having pending write requests. Embodiments may also provide power management benefits by adaptively closing a row early, based at least in part on information such as prediction information (e.g., histogram information) that identifies instances when a row is not likely to see many more hits. To this end, embodiments may track historical information regarding hits to a row present in sense amplifier circuitry, and adaptively determine an open duration based thereon. In one embodiment, a memory controller or other control circuitry may determine what fraction of requests would result in row hits if a row were held open for different lengths of time. Based on these computed fractions, an open duration can be dynamically controlled to ensure that a substantial fraction of requests would still result in row hits.

Figure 1:
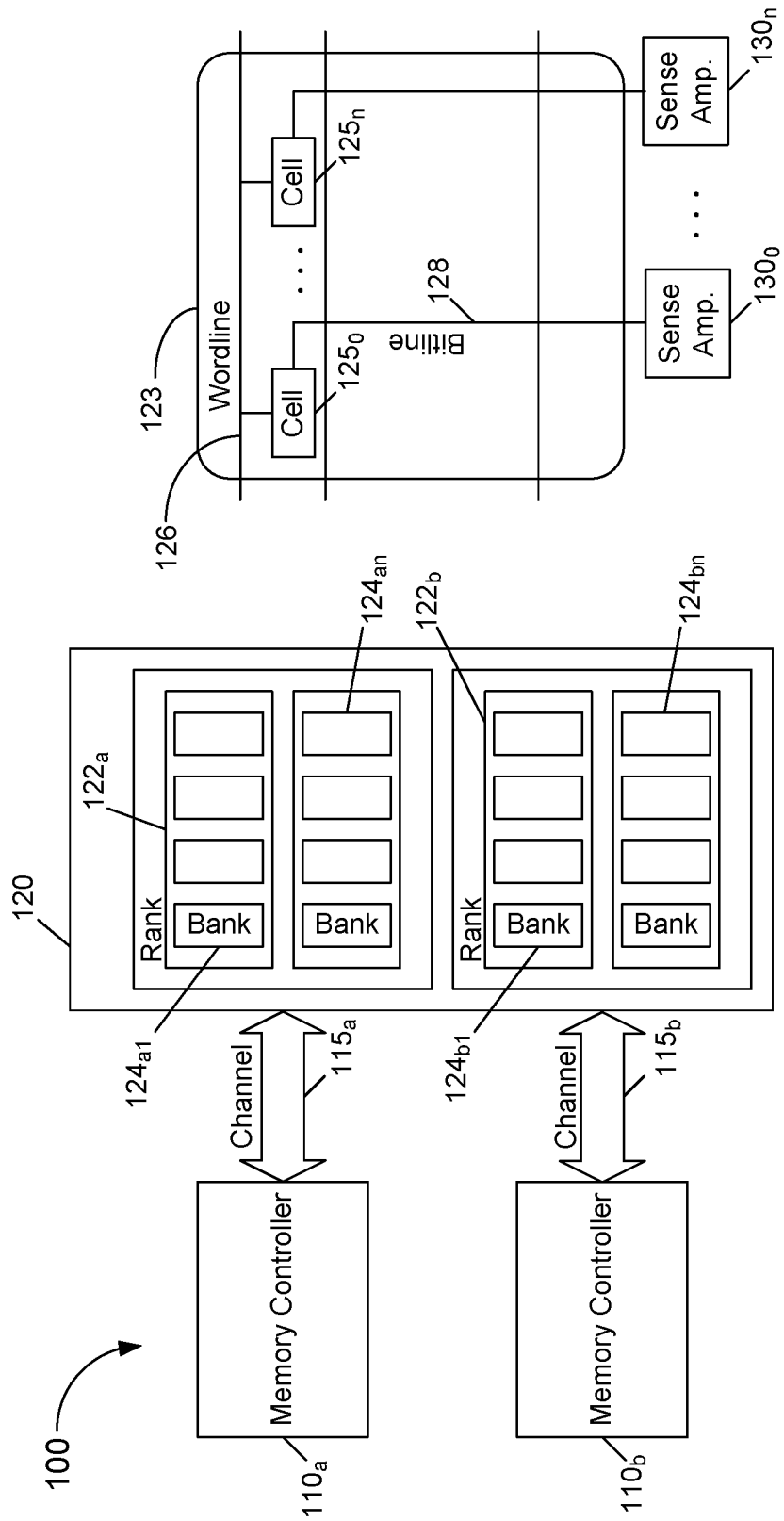
FIG. 1 is a block diagram of a memory architecture in accordance with an embodiment of the present invention.

Referring now to FIG. 1, shown is a block diagram of a memory architecture in accordance with an embodiment of the present invention. As shown in FIG. 1, architecture 100 includes memory controllers $110_a$, $110_b$, each of which couples to corresponding portions of a memory 120 via corresponding channels $115_a$, $115_b$. In example embodiments, memory controllers 110 may be integrated memory controllers of a processor such as a multicore processor or other system on chip (SoC). In other cases, memory controller circuitry of course may be located within different portions of a system. For example, at least some of the memory controller circuitry may be implemented internally to memory circuitry itself. In turn, channels 115 may be implemented, at least in part, via memory interconnects to couple memory controllers 110 to memory 120.

As illustrated, memory 120, which may be implemented as a DRAM memory, includes multiple ranks $122_a$, $122_b$, each of which includes a plurality of banks $124_{a1-an}$, $124_{b1-bn}$. Understand while two ranks are shown for illustrative purposes, in a given memory more ranks may be included (and similarly, many more memory controllers and channels also may be present). In turn, each bank 124 may include one or more subarrays formed of a two dimensional array of DRAM cells. More specifically as further shown in FIG. 1, a given subarray 123 of bank 124 may include a plurality of cells $125_0$-$125_n$, each of which couples between a corresponding wordline 126 and a corresponding bitline 128. In turn each bitline 128 (to which a column of cells are coupled (not shown in FIG. 1)) couples to a corresponding sense amplifier $130_0$-$130_n$. In the arrangement of FIG. 1, a horizontal collection of cells 125 forms a row which, when sensed and amplified within sense amplifiers 130, may then be accessed for read and/or write operations as a given row. In this way, sense amplifiers 130 act as a row buffer to maintain data of a given row while that row remains open. Note that each memory cell 125 may be implemented with at least one capacitive element to store data in the form of charge. Although not shown for ease of illustration in FIG. 1, understand that each memory cell 125 couples to a given bitline 128 via an access transistor. As such, subarrays 123 may be implemented in a two dimensional row and column format, where a plurality of cells 125 horizontally couple to a given wordline 126 and similarly a plurality of cells 125 vertically couple to a given bitline 128.

Figure 2:
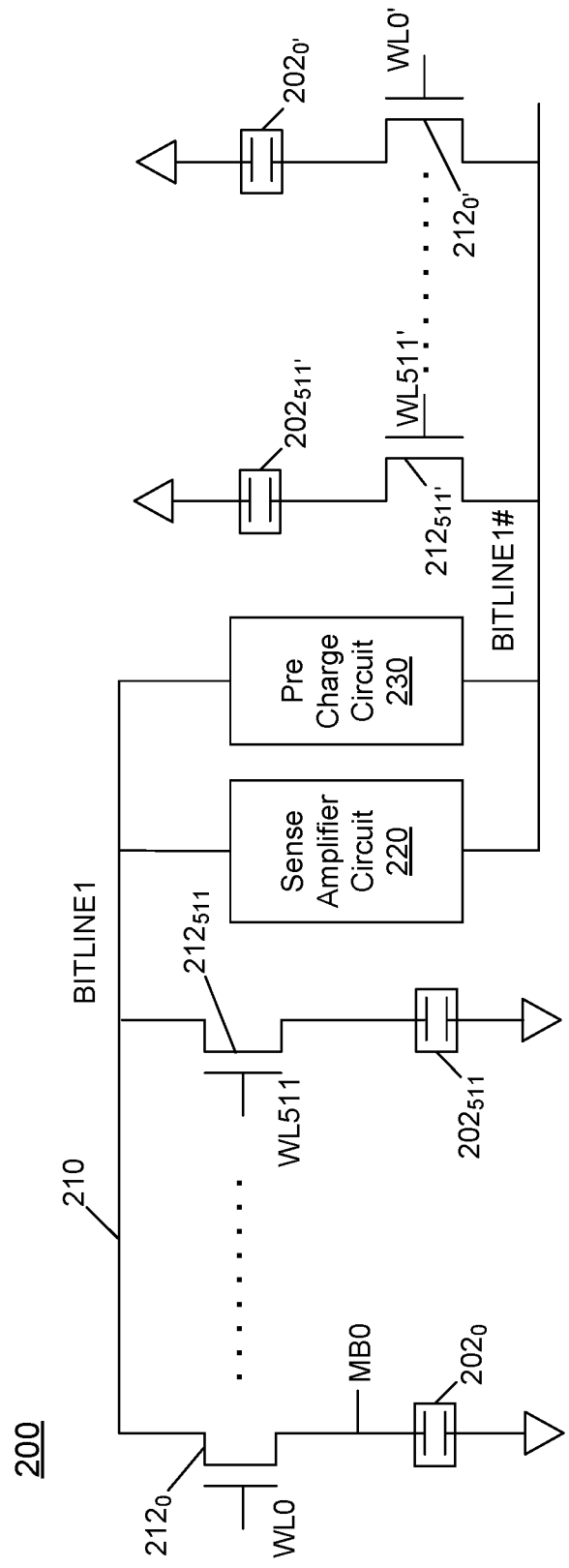
FIG. 2 is a schematic diagram of a bitline column in accordance with an embodiment.

Referring now to FIG. 2, shown is a schematic diagram of a bitline column in accordance with an embodiment. As illustrated in FIG. 2, bitline column 200 may include a plurality of storage cells $202_0$-$202_{511}$ and $202_{0'}$-$202_{511'}$, also referred to as bitcells. Understand while in the example shown, 512 memory cells are coupled to a single shared bitline 210, the scope of the present invention is not limited in this regard and in other embodiments more or fewer cells may be coupled to a given bitline. To access a given cell 202 of a column of such cells, a corresponding wordline (WL) coupled to a gate terminal of a corresponding access transistor $212_0$-$212_{511}$ may be enabled to couple the charge in bitcell 202 to perturb bitlines 210, 210'. In turn, the perturbation to bitlines 210, 210', which occurs in a charge sharing phase of an activation operation, is sensed in a sense amplifier circuit 220 coupled to bitlines 210, 210'. More specifically, the perturbation to the bitlines is sensed and amplified within sense amplifier circuit 200, thereby raising the bitline voltage to 0 or VDD, corresponding to a data value of a logic 0 or a logic 1, respectively. Note further that this bitline voltage also may restore the charge lost from a given cell 202 during the sensing operation. As such, before another cell 202 connected to the same bitline is to be accessed, the bitline may be charged to a predetermined voltage (e.g., VDD/2). To this end, a precharge circuit 230 couples to bitlines 210, 210' to enable precharge of the corresponding bitlines. Understand while shown at this high level in the embodiment of FIG. 2, many variations and alternatives are possible.

Figure 3:
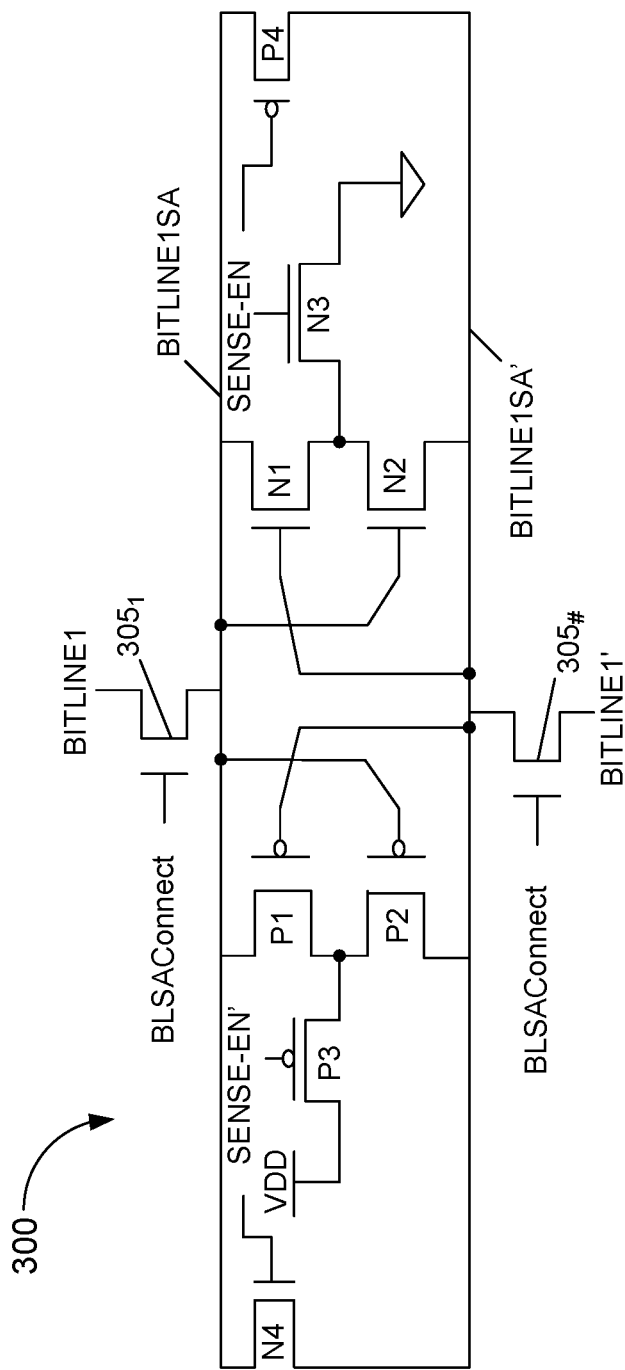
FIG. 3 is a schematic diagram of a sense amplifier in accordance with an embodiment.

Referring now to FIG. 3, shown is a schematic diagram of a sense amplifier in accordance with an embodiment. As shown in FIG. 3, sense amplifier 300 is a single sense amplifier that couples between corresponding bitlines (BITLINE1 and BITLINE1#). Understand that in a given subarray, multiple sense amplifiers may be provided, each associated with a corresponding bitline such that a collection of sense amplifiers each coupled to a corresponding bitline forms a so-called row buffer. As seen, these bitlines couple to sense amplifier 300 via corresponding isolation transistors $305_1$, $305_\#$. As will be described herein, when isolation transistors 305 are enabled (by way of a gate signal (BLSAConnect)), sense amplifier 300 is connected to the bitlines (and in certain phases of operation to precharge circuitry). When isolation transistors 305 are disabled, sense amplifier 300 remains disconnected from such bitlines (and precharge circuitry), enabling simultaneous read and precharge operations to occur. As such, isolation transistors 305 electrically connect or disconnect the bitlines (and more generally a memory array) from sense amplifier 300 to provide isolation between sense amplifier 300 and the bitlines. In embodiments, isolation transistors 305 may be sized and biased appropriately such that an activation latency ($t_{RCD}$) can be reduced further, while minimally increasing charge restoration latency.

Isolation transistors 305 are turned on to couple sense amplifier internal nodes (BITLINE1SA and BITLINE1SA') to the bitlines, during sense amplification and writeback phases of DRAM operation using the BLSAConnect signal. In an embodiment BLSAConnect may be overdriven, as isolation transistors 305 are sized to minimize leakage with medium on resistance. With medium on resistance of isolation transistors 305, activation latency may be lowered as the isolation transistor's resistance shields sense amplifier 300 from the highly capacitive bitlines. In one embodiment, isolation transistors 305 may be sized having a width and length that is not a source of undesirable crosstalk in the bitlines. To this end embodiments may use transistors having a small device width with a reasonable device length. Such sizing with a width and length (W/L) ratio of between approximately 0.25 and 0.5 may enable an activation latency ($t_{RCD}$) reduction of 15%-25% for a charge restoration time ($t_{RAS}$) increase of 5%. Such isolation transistor sizing may also trade off speed and leakage. BLSA Connect is overdriven similar to the wordline. In this way, the sense amplifier amplification phase is speeded up, lowering $t_{RCD}$. Such arrangement may reduce latency as the workloads running on modern systems show higher sensitivity to $t_{RCD}$ than $t_{RAS}$ and write time ($t_{WR}$).

After an activation operation, once it is timing safe to precharge, isolation transistors 305 are turned off to disconnect precharge circuitry (e.g., 230 in FIG. 2) and sense amplifier 220 (or detailed sense amplifier 300), if there are no pending write requests to the open row. The precharge can then be issued while sense amplifier 220 continues to hold the contents of a previously activated row. Hence, read requests can be served from sense amplifier 220 while the precharge operation occurs, thereby effectively overlapping them. When there are pending write requests to a row, sense amplifier 220 remains connected to the bitlines, thereby not increasing write latency. When a next activate command is issued, the precharge of sense amplifier 220 is overlapped with a charge sharing phase of the activation operation, causing no increase in activation latency.

As illustrated in FIG. 3, sense amplifier 300 includes a buffer circuit formed of metal oxide semiconductor field effect transistor (MOSFET) pairs that form a cross-coupled inverter coupled between complementary sense amplifier internal nodes (namely BITLINE1SA and BITLINE1SA#). As illustrated in FIG. 3, n-channel MOSFETs (NMOS) N1, N2 are coupled in series between the internal nodes and in turn p-channel MOSFETs (PMOS) P1, P2 also couple in series between the internal nodes. More specifically as illustrated NMOS N1 has a drain terminal coupled to a first internal node (BITLINE1SA), a gate terminal coupled to a second internal node (BITLINE1SA#), and a source terminal coupled to a control transistor N3. Control transistor N3 in turn has a gate terminal coupled to receive a sense enable signal (SENSE-EN) and a source terminal coupled to a ground potential.

In turn, PMOS P1 has a drain terminal coupled to the first internal node, a gate terminal coupled to the second internal node, and a source terminal coupled to a control transistor P3. Control transistor P3 in turn has a gate terminal coupled to receive a complementary sense enable signal (SENSE-EN') and a source terminal coupled to a supply voltage (VDD).

Embodiments may further reduce activation latency by precharging or equalizing internal nodes of sense amplifier 300 during a charge sharing phase of an activation operation. To this end, to enable equalization of the complementary internal nodes to provide for proper sense amplifier operation, the internal nodes may be controllably coupled together via corresponding equalization transistors N4, P4. Note that equalization transistors N4, P4 may be controlled via the same sense enable signals provided to corresponding control transistors P3, N3 (respectively). As such, with an active or high sense enable signal (SENSE-EN), equalization transistor P4 is turned off (and similarly, with an inactive SENSE-EN' signal, equalization transistor N4 is turned off). Instead, with an inactive or low sense enable signal, corresponding equalization transistor P4 is turned on (and similarly, with an active SENSE-EN' signal, equalization transistor N4 is turned on).

As such, when equalization transistors N4, P4 are active, the internal nodes couple together to equalize their charge. As described herein, this sense amplifier internal node equalization may overlap with a charge sharing phase of an activation operation, avoiding an increase in activation latency. Stated another way, equalization transistors N4, P4 are adapted to enable overlapping the precharge of sense amplifier 300 with the charge sharing phase of the activate operation. This is so, as these internal nodes do not equalize during a precharge operation of the bitlines, which occurs while the sense amplifier serves read requests and is disassociated from the bitlines. However, for a successful DRAM read operation, the internal nodes of the sense amplifier have to be equalized. Note that equalization transistors N4, P4 are enabled/disabled by the sense enable signal provided to control transistors P3, N3, thereby requiring no additional control signals. Equalizer transistors N4, P4 can be sized to minimize area overhead.

Figure 4:
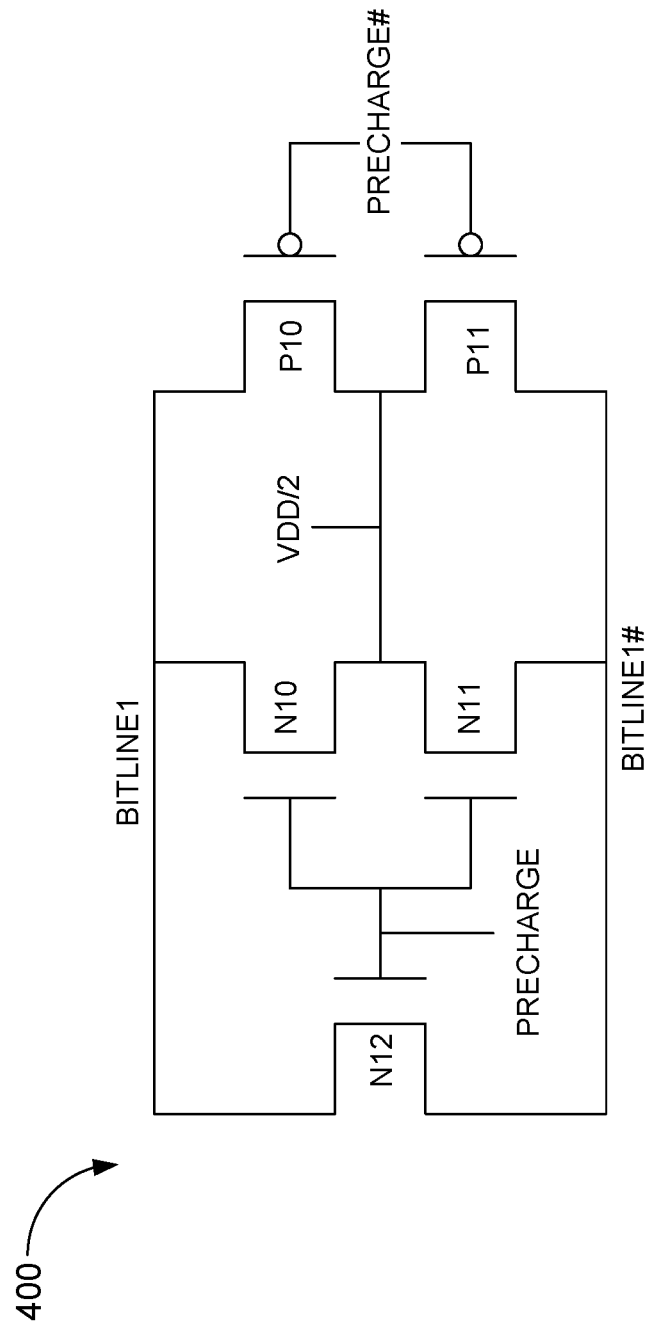
FIG. 4 is a schematic diagram of a precharge circuit in accordance with an embodiment of the present invention.

Referring now to FIG. 4, shown is a schematic diagram of a precharge circuit in accordance with an embodiment of the present invention. As shown in FIG. 4, precharge circuit 400, when enabled may be used to equalize charge on complementary bitlines. As illustrated, precharge circuit 400 includes a pair of PMOS transistors P10, P11 coupled in series between the complementary bitlines and a pair of NMOS transistors N10, N11 also coupled in series between the complementary bitlines. As illustrated, a common voltage node (namely at a voltage level of VDD/2) couples to source terminals of these series-coupled transistors. In turn, a precharge control signal (PRECHARGE) couples to the gate terminals of NMOS transistors N10, N11 and a complementary precharge control signal (PRECHARGE#) couples to the gate terminals of PMOS transistors P10, P11. As further illustrated, the precharge control signal further couples to a gate terminal of another NMOS transistor N12, coupled between the complementary bitlines. Thus when appropriately enabled, precharge circuit 400 equalizes charge on the complementary bitlines, which may occur concurrently with access operations to data stored in sense amplifiers.

Figure 5:
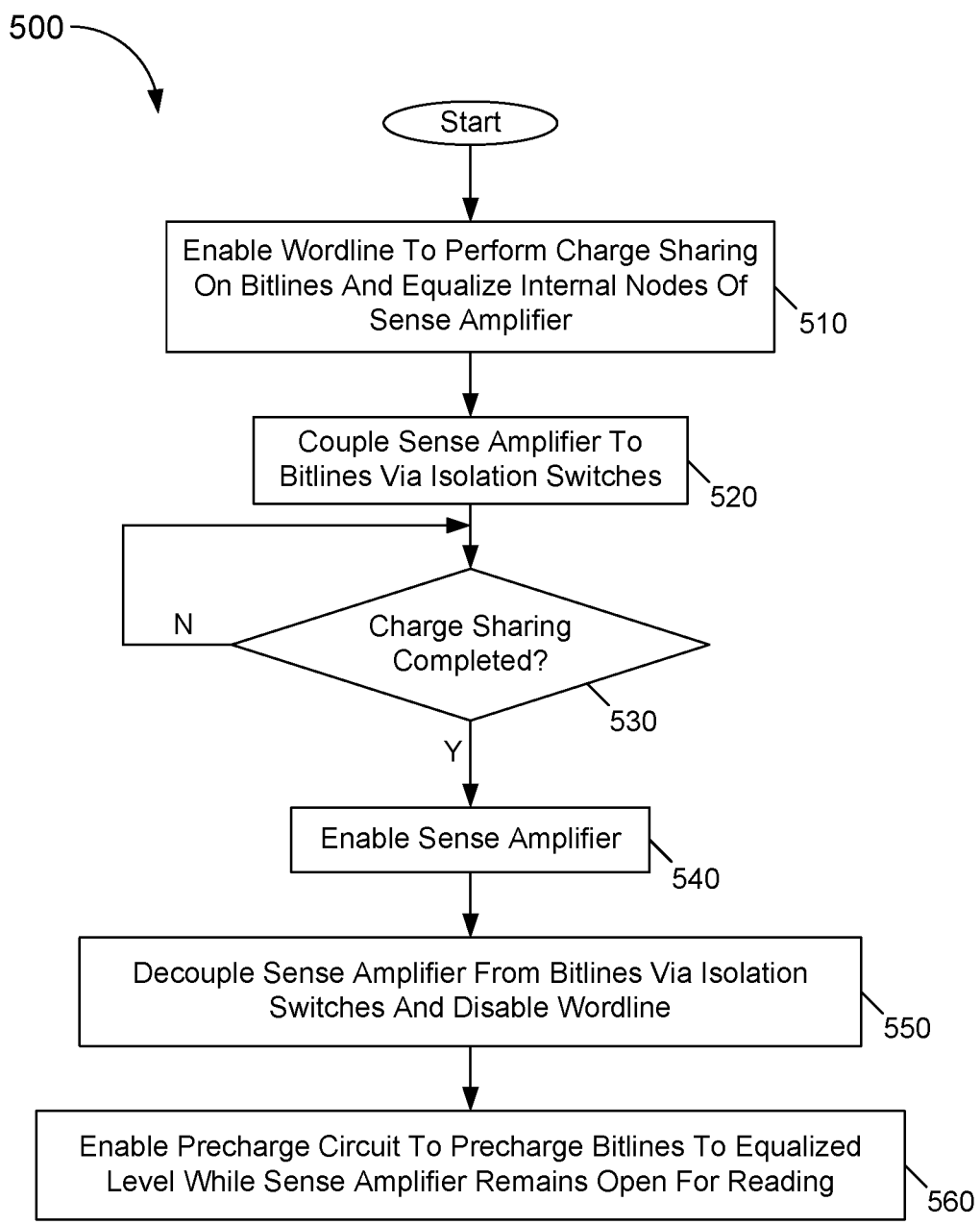
FIG. 5 is a flow diagram of control operations performed within a memory in accordance with an embodiment.

Referring now to FIG. 5, shown is a flow diagram of control operations performed within a memory in accordance with an embodiment. In embodiments, method 500 may perform by hardware circuitry, firmware and/or software. More specifically, method 500 may be performed by control circuitry within a memory to perform precharge, activation and other operations as described herein.

At block 510 a given wordline may be enabled. In this way, the enabled wordline allows charge stored in memory cells of the enabled row to be output via corresponding bitlines. Note that this operation to access a given row of the memory may begin by way of this wordline enable and sense amplifier internal node equalization, in response to an activate command from a memory controller. This is the case, as the bitlines may already have been precharged in response to a prior operation (e.g., responsive to a combined activate and precharge command (for read operations, where the memory may internally trigger the precharge when it is timing safe to do so (namely when a restoration latency lapses)). Instead for write operations, the memory controller may issue the precharge command after it is timing safe to do so when there are no remaining write requests to a given row.

In any event, depending upon the value stored in a given bitcell, a corresponding bitline may be pulled high or low. At the same time, internal nodes of a sense amplifier may be equalized by way of equalization transistors. Next at block 520 the sense amplifier can be coupled to the bitlines via isolation switches to thus enable the sensing and amplification of the values provided by the bitlines.

With reference still to FIG. 5, next it is determined whether a charge sharing phase has completed (diamond 530). In some embodiments, a fixed duration may be used, which may have a reduced latency given the overlapping of internal node equalization with charge sharing. When it is determined that the charge sharing phase (overlapped with the sense amplifier internal node equalization) has completed, control passes to block 540 where the sense amplifier is enabled (e.g., in response to a sense enable signal). At this point the appropriate value is stored in the sense amplifier and access operations may proceed via the sense amplifier. Next, at block 550 the sense amplifier may be decoupled from the bitlines via the isolation switches and furthermore, the wordline may be disabled, as the stored value is restored to the bitcell.

Finally at block 560 the precharge circuit is enabled to precharge the bitlines to an equalized level. To this end, a precharge signal is activated to enable the precharge circuit to equalize voltage level on the bitlines. In this way, the memory array is ready to access another row. Note however that during this precharge operation at block 560, the sense amplifier remains open for reading, as it is decoupled from the bitlines at this point. As such, simultaneous read and precharge may occur to increase performance by way of reduced latencies. Understand that after this precharge operation, the precharge circuit may be disabled (e.g., by disabling the precharge signal). At this point, the given bank is ready to handle an activation to another row. Understand while shown at this high level in the embodiment of FIG. 5, many variations and alternatives are possible.

Figure 6:
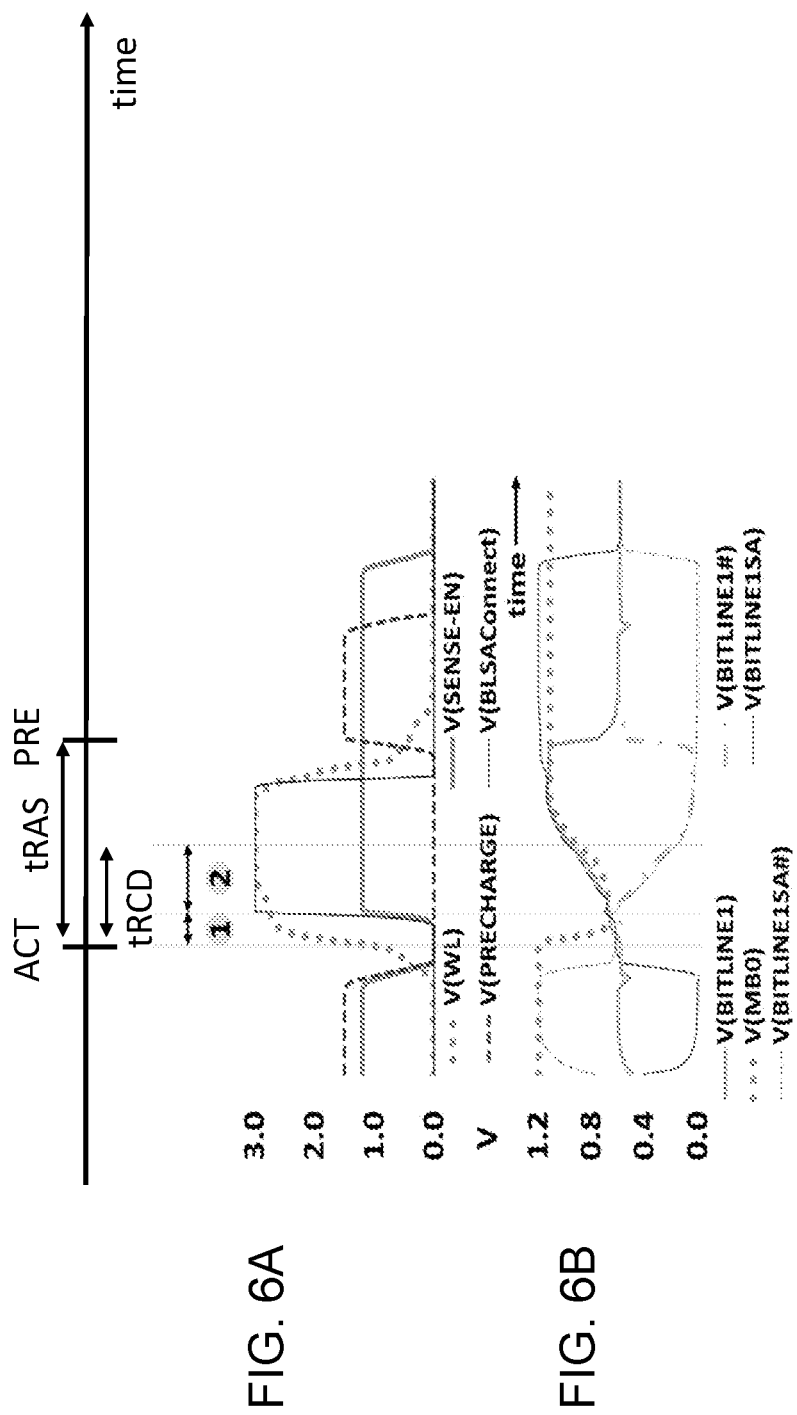
FIGS. 6A and 6B are timing diagrams of representative signaling in a memory architecture in accordance with an embodiment.

Referring now to FIGS. 6A and 6B, shown are timing diagrams of representative signaling in a memory architecture in accordance with an embodiment. As illustrated in FIG. 6A, prior to accessing a row of the memory, a precharge operation occurs by way of application of a precharge signal, V(PRECHARGE), used to control the precharge circuit. Note that while such precharge operation occurs, a corresponding sense amplifier may remain enabled (by way of an active sense enable signal (V(SENSE-EN))), such that data of a prior accessed row can still be read. As such, simultaneous read and precharge is realized.

Substantially at the conclusion of the precharge operation, an activate command is issued from memory controller to the memory. In different cases, this activation may be a combined activate and precharge command for read operations (or in other embodiments, separate activate and precharge commands may be sent even in the case of read operations). And for write operations, an activate command is first issued and a precharge command is issued only when there are no remaining write hits to the row. Note that the time duration between effectuation of the activate and precharge commands corresponds to a charge restoration time ($t_{RAS}$).

Still with reference to FIG. 6A, substantially coincident with the activate command, the sense amplifier is disabled from further access operations until data of a new row becomes available. More specifically as shown in FIG. 6A, a given wordline is accessed (by way of overloading an access transistor with a wordline voltage (V(WL))). By this enabling of the access transistor, charge stored in a bitcell is thus applied to the corresponding bitline, leading to a charge sharing operation. Note further at this same time, internal node equalization within the sense amplifier occurs (which occurs when the sense amplifier is disabled). Thus as illustrated in FIG. 6B, the internal nodes of the sense amplifier at this point become equalized (namely the voltage on internal nodes V(BITLINE1SA) and V(BITLINE1SA#). After this concurrent charge sharing and equalization operation, the sense amplifier is coupled to the bitlines (by way of a control signal (V(BLSAConnect)) provided to the isolation transistors). Furthermore at this point the sense amplifier is enabled. As such, after an activation latency is concluded (formed of time periods 1 and 2 in FIG. 6A) data is appropriately sensed and amplified (and buffered) within the sense amplifier such that it may be read out. Note that thereafter the wordline is disabled and the sense amplifier is decoupled from the bitlines (by way of disabling of the isolation transistor control signal). However, the sense amplifier remains enabled, even during a next precharge operation.

Still with reference to FIG. 6A, note that at the conclusion of the charge restoration time duration, the precharge command may be effectuated to initiate precharge of the bit cells. Note also in FIG. 6A that the sense amplifier remains enabled concurrently with the precharge such that continued read operations to a previously accessed row may continue to occur.

Figure 7:
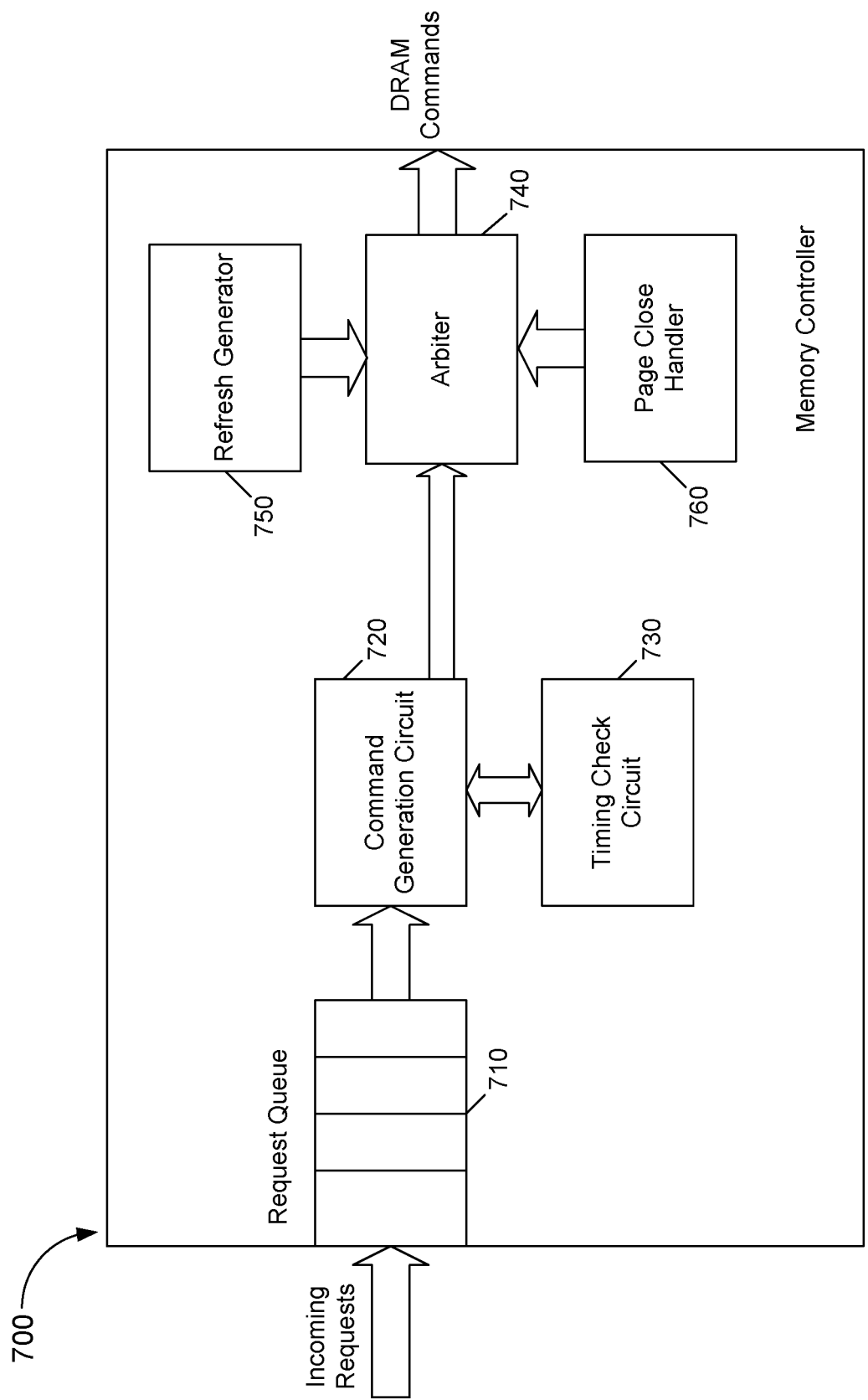
FIG. 7 is a block diagram of a memory controller in accordance with an embodiment of the present invention.

Referring now to FIG. 7, shown is a block diagram of a memory controller in accordance with an embodiment of the present invention. As shown in FIG. 7, memory controller 700 may be an integrated memory controller included within a processor such as an SoC or other multicore processor. As illustrated, incoming requests are received and stored within a request queue 710. The incoming requests are thereafter provided to a command generation circuit 720, which may generate appropriate commands based on the incoming requests (read and write requests). As further illustrated, a timing check circuit 730 is coupled to command generation circuit 720. By way of timing check circuit 730, it is possible to issue read commands (e.g., read column address strobe (CAS) commands) to a memory to read data from a row even after a precharge operation has begun to the bank including that row. However, timing check circuit 730 may cause issuance of write CASes only to a bank before such precharge.

Commands may be sent from command generation circuit 720 to an arbiter 740, which arbitrates these commands with additional commands including refresh commands received from a refresh generator 750 and page close commands received from a page close handler 760. In embodiments, page close handler 760 may be configured to determine when to close a row by issuance of precharge to the row, when an embodiment of the SRP is no enabled. Based on arbitration decisions within arbiter 740, appropriate DRAM commands are sent to the corresponding memory. Understand while shown at this high level in the embodiment of FIG. 7, many variations and alternatives are possible.

Figure 8:
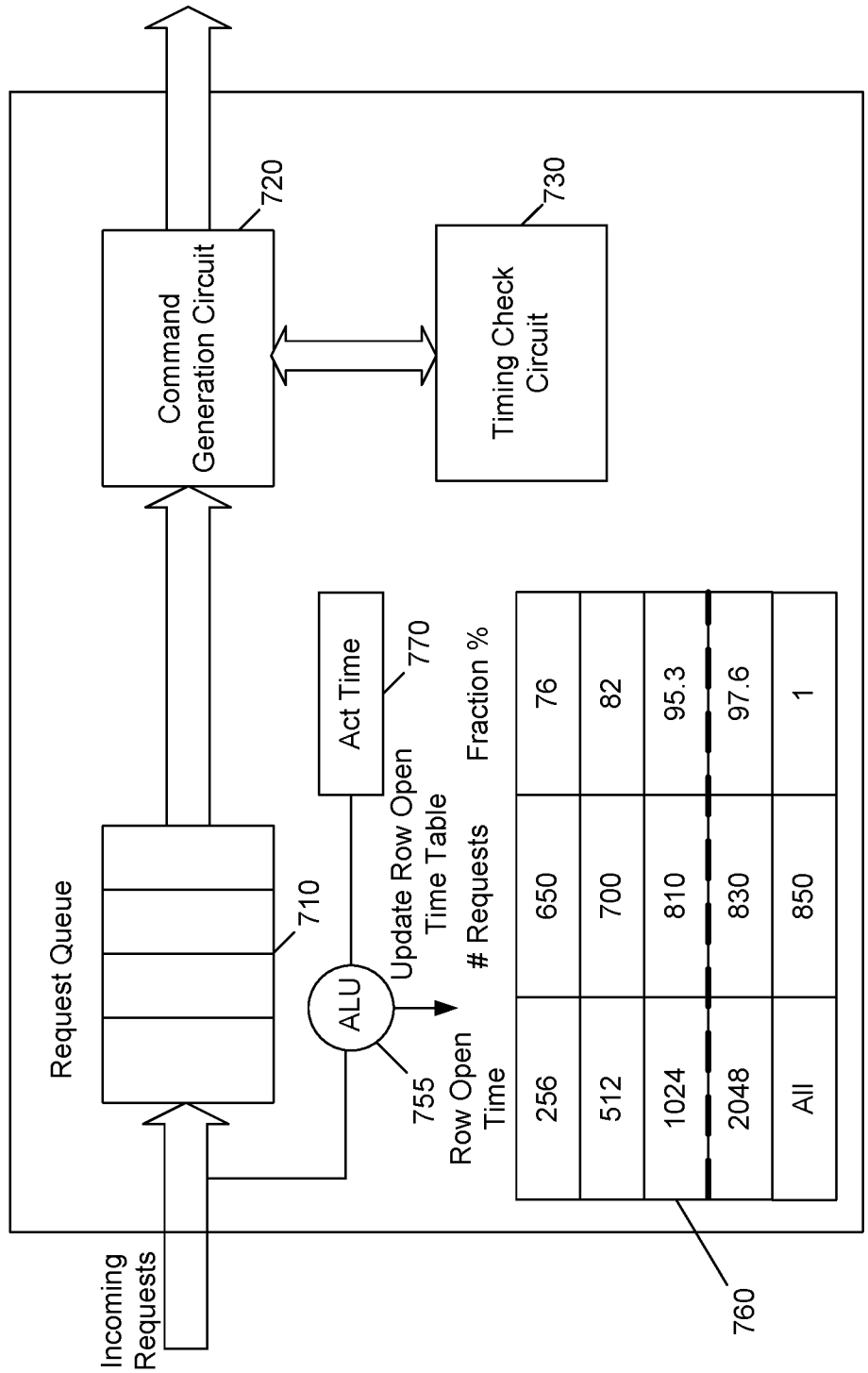
FIG. 8 is a block diagram of further details of a memory controller in accordance with an embodiment.

Referring now to FIG. 8, shown is a block diagram of further details of a memory controller in accordance with an embodiment. As illustrated in FIG. 8, memory controller 700' may generally be implemented the same as memory controller 700. However, further details are shown to enable dynamic idle row open time in accordance with an embodiment. More specifically, incoming requests are provided to an arithmetic logic unit (ALU) 755, in addition to request queue 710. In ALU 755, a time of arrival (with respect to a given row activation (stored in an activation time storage 770)) is determined.

This time duration is then used to update an open time table 780. As illustrated, table 780 includes a plurality of entries each associated with a time duration (e.g., in clock cycles) since a last row activation (a row open time) and a number of requests for that row received since that activation. As such, table 780 maintains histogram information. This information may, at a conclusion of an evaluation internal, be analyzed to determine a fraction of total requests for a given row that would result in row hits for different row open time frames. In an embodiment, a memory controller may be configured for a given hit threshold. Then an entry of the table that has a minimal fraction that exceeds this hit threshold may be selected as the row open time to be used for the next evaluation internal. In an embodiment, this row open time (which may be measured in clock cycles since row opening) may be stored in a configuration storage, e.g., within timing check circuit 730. More specifically as illustrated in FIG. 8, open time table 780 includes a plurality of entries each identifying a row open time, a number of requests to a row that occurred within such row open time and a resulting fraction. Note that in many cases, the fractional information may be dynamically determined and in some cases may not be part of the table itself. With specific reference to entries shown in FIG. 8, example entries may be for a row open time of 256, namely 256 clock cycles from an open time during which 650 requests are received (resulting in a fractional percentage of total requests of 76%). Also shown is an entry for an open time of 1024 cycles, during which 810 requests were received, resulting in a fractional hit rate of 95.3%.

Assuming that a hit threshold is set at 95%, this particular entry is thus the minimal fraction that exceeds the hit threshold. As such, in the example shown in FIG. 8, the row open time for a next control interval may be set at 1024 clock cycles. Of course many other examples are possible. Understand while shown at this high level in the embodiment of FIG. 8, many variations and alternatives are possible.

Figure 9:
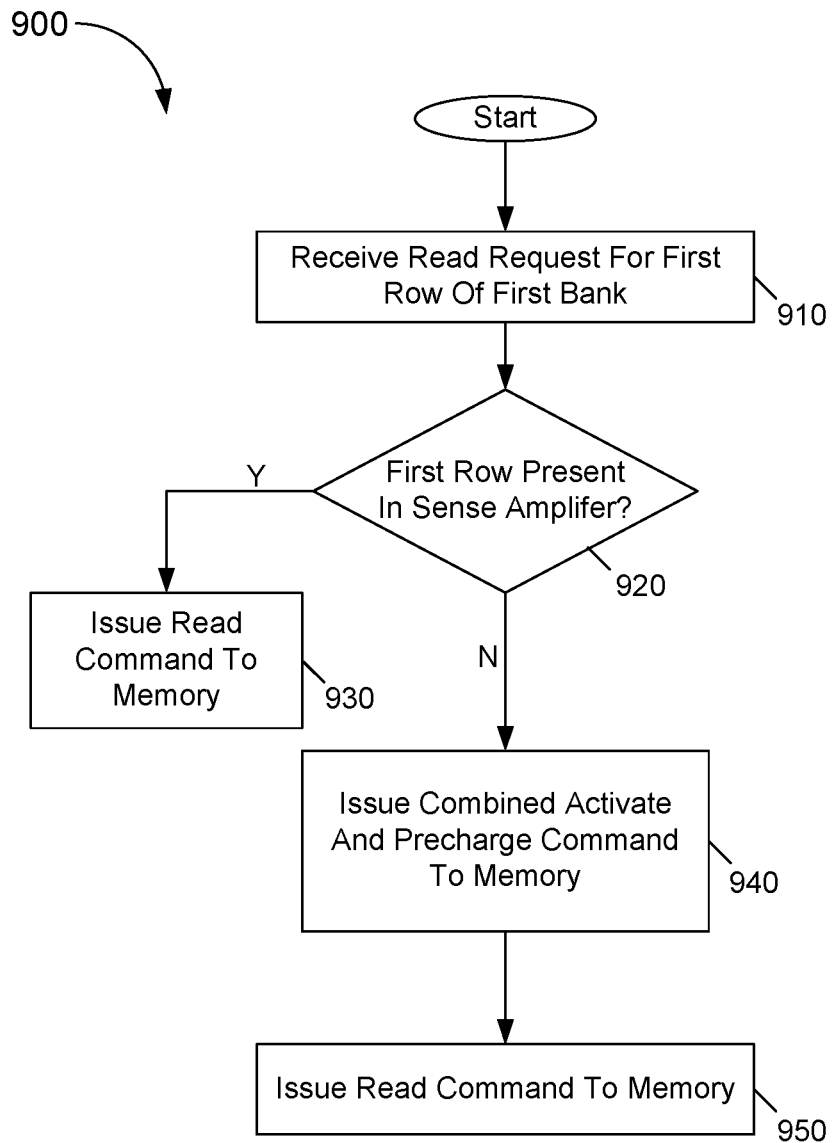
FIG. 9 is a flow diagram of a method in accordance with another embodiment of the present invention.

Referring now to FIG. 9, shown is a flow diagram of a method in accordance with another embodiment of the present invention. More specifically as shown in FIG. 9, method 900 is a method for handling read requests in a memory controller in accordance with an embodiment. As such, method 900 may be performed by hardware circuitry, firmware, software and/or combinations thereof. As illustrated, method 900 begins by receiving a read request within the memory controller (block 910). More specifically, assume that this read request is to read data stored in a first row of a first bank of a memory. Control passes to diamond 920 to determine whether this first row is present in sense amplifier circuitry of the first bank. If so, control passes to block 930 where the read command may be directly issued to the memory. That is, there is no need for precharge and/or activate commands to be sent, as the row is already accessible within the sense amplifier circuitry.

Otherwise if it is determined that the first row is not present within the sense amplifier circuitry, control passes to block 940 where the memory controller may issue a combined activate and precharge command to the memory. Understand that as described herein this combined command activates the first row of this bank so that the data of this first row can be stored within the sense amplifier circuitry. As such, at block 950 a read command can be issued to the memory. Note that in embodiments herein, this read command (which may be sent as a read (CAS command) may not be sent until an activation latency is completed. Note that for additional read operations to the same row, additional read CAS's can be sent to the memory until there is a need to activate another row of the same bank or until a given open duration (as dynamically determined as described herein) is concluded. Furthermore understand that while this read is being handled within the memory, the precharge operation of the combined activate and precharge command may be performed concurrently with accessing the data within the sense amplifier circuitry after the charge restoration latency ($t_{RAS}$) has expired. Understand while shown at this high level in the embodiment of FIG. 9, many variations and alternatives are possible.

As seen, for read operations sense amplifiers can be isolated from bitlines, to support parallel reads and precharges without any other latency cost. However for writes, issuing a combined activate and precharge command would cause write requests to the row held in the sense amplifier to be delayed, since the written data would have to be restored and a restoration operation would have to wait for the precharge to complete. In embodiments, efficient write operation management may be realized by issuing combined activate and precharge commands only if there are no pending write requests to a row. Otherwise, a separate activate command is issued, and then a precharge command is issued to close a row after there are no write hits to the currently activated row, as the sense amplifier is to stay connected to the bitlines to serve writes. Such a scheme may be effective in capturing row locality for writes, since write requests are usually queued and drained in a burst. As a result, write latency may be decreased while retaining low complexity.

Figure 10:
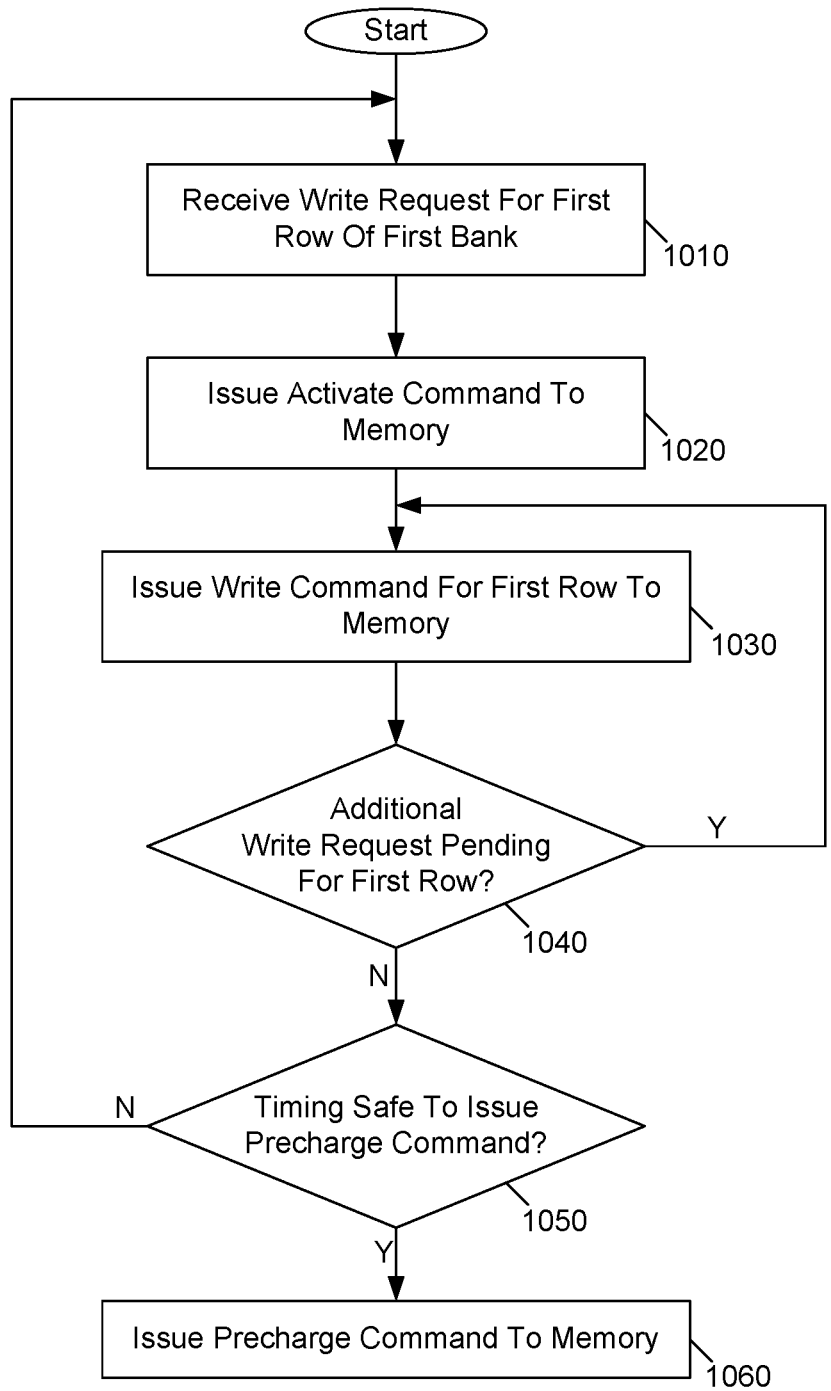
FIG. 10 is a flow diagram of a method in accordance with another embodiment of the present invention.

Referring now to FIG. 10, shown is a flow diagram of a method in accordance with another embodiment of the present invention. More specifically as shown in FIG. 10, method 1000 is a method for handling write requests in a memory controller in accordance with an embodiment. As such, method 1000 may be performed by hardware circuitry, firmware, software and/or combinations thereof. As illustrated, method 1000 begins by receiving a write request within the memory controller, e.g., to write data to a first row of a first bank of a memory (block 1010). Control passes to block 1020 where an activate command is issued to the memory (not a combined active and precharge command). Assuming that an activation latency has completed, control passes to block 1030 where a write command may be issued to the memory. Still with reference to FIG. 10, next it is determined at diamond 1040 whether there is an additional write request pending for this same first row. For example, the memory controller can analyze entries in a request queue to determine whether any additional write requests exist for this memory row. If so, control passes back to block 1030 where another write command can be issued to the memory.

If it is determined that no additional write requests remain pending for this first row, control next passes to diamond 1050 to determine whether it is timing safe to issue a precharge command. Although the scope of the present invention is not limited in this regard, in an example embodiment it may be timing safe to issue a precharge command at a conclusion of a charge restoration latency. When it is determined that it is timing safe to issue the precharge command, control passes from diamond 1050 to block 1060 where the precharge command is issued to the memory to cause the memory to precharge the bitlines, as described herein. Understand while shown at this high level in the embodiment of FIG. 10, many variations and alternatives are possible.

Embodiments may reduce the power impact from holding data in the sense amplifier for relatively long durations according to SRP operation, in order to retain data in them beyond a precharge until the next activate. It is noted that a significant fraction of requests to a row arrive within a number of cycles from when the row was open. Hence, the sense amplifiers can be disabled after a certain number of cycles, which may reduce unnecessary idle power consumption. Specifically, the number of requests that arrive at a row may be tracked for different lengths of time after a row is activated. For each request, the time between the request arrival and the time of the previous activate are computed. This time may be used to update a corresponding entry in a row open time table. Periodically, the fraction of requests that would result in row hits for different row open times is computed. The row open time for that application phase is determined as the minimum row open time such that a given hit threshold (e.g., in terms of fraction of requests) hit in the sense amplifiers. Such operation may reduce the number of cycles that the sense amplifier holds data.

Figure 11:
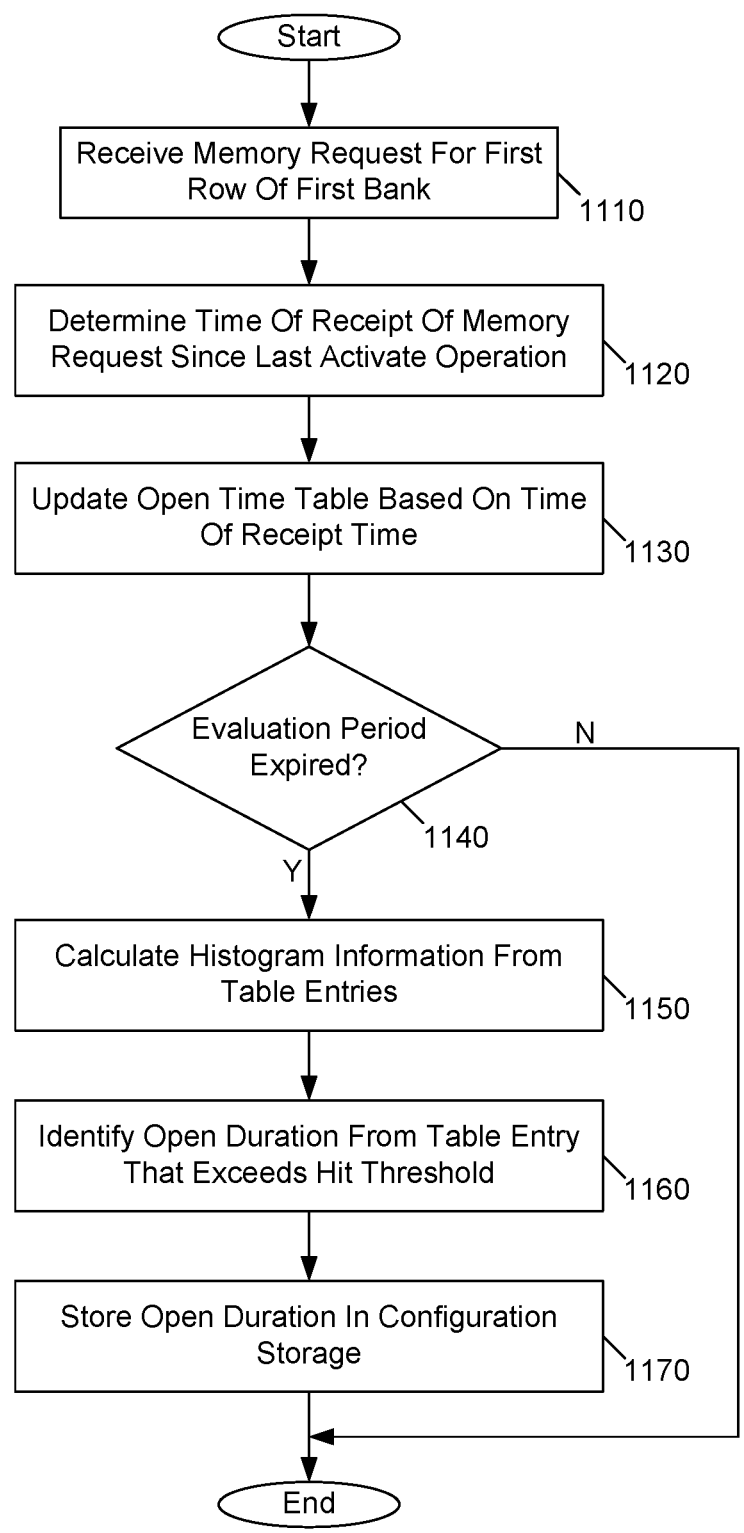
FIG. 11 is a flow diagram of a method in accordance with yet another embodiment of the present invention.

Referring now to FIG. 11, shown is a flow diagram of a method in accordance with yet another embodiment of the present invention. As shown in FIG. 11, method 1100 is a method for dynamically controlling open duration for rows based on performance metric information, e.g., as performed in a memory controller in accordance with an embodiment. As such, method 1100 may be performed by hardware circuitry, firmware, software and/or combinations thereof. As illustrated, method 1100 begins by receiving a memory request for a first row of a first bank of a memory (block 1110). At block 1120 a time of receipt of the memory request since the last activate operation is determined. Thereafter at block 1130 an open time table may be updated based on this time of receipt (block 1130). For example, multiple entries can be incremented if the duration is less than the open time of these multiple entries. Next it is determined whether an evaluation period has expired (diamond 1140).

If it is determined that the evaluation period has expired, control passes to block 1150 where histogram information may be calculated from the table entries. More specifically, based on the counts of each entry, a fraction of the total number of requests for an open row for the given entry can be determined. From these different fractions, at block 1160 an open duration can be identified from a given table entry. More specifically, this open duration may correspond to the table entry having a minimal fraction of hits that exceeds a given hit threshold. In turn this open duration (e.g., in terms of cycles) may be stored in a configuration storage (block 1170). As such, this open duration may be used to determine when it is appropriate to close a given row. Note that the close command may not be sent explicitly every time from the memory controller. The open duration may be sent to the memory periodically, as a separate command or piggy-backed onto another request. The sense enable signal can then be controlled and disable internally in the memory. Understand while shown at this high level in the embodiment of FIG. 11, many variations and alternatives are possible. Using an embodiment, performance improvements may be realized in, e.g., memory latency-sensitive workloads, while at the same time reducing sense amplifier idle power.

As described above, a memory controller may be integrated within a processor or other SoC. Such processor may include processor cores that may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Figure 12A:
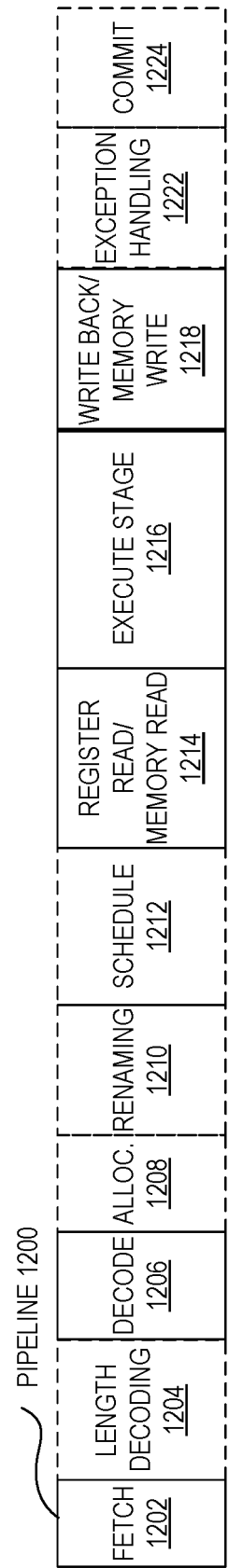
FIG. 12A is a block diagram illustrating both an exemplary in-order pipeline and an exemplary register renaming, out-of-order issue/execution pipeline according to embodiments of the invention.
Figure 12B:
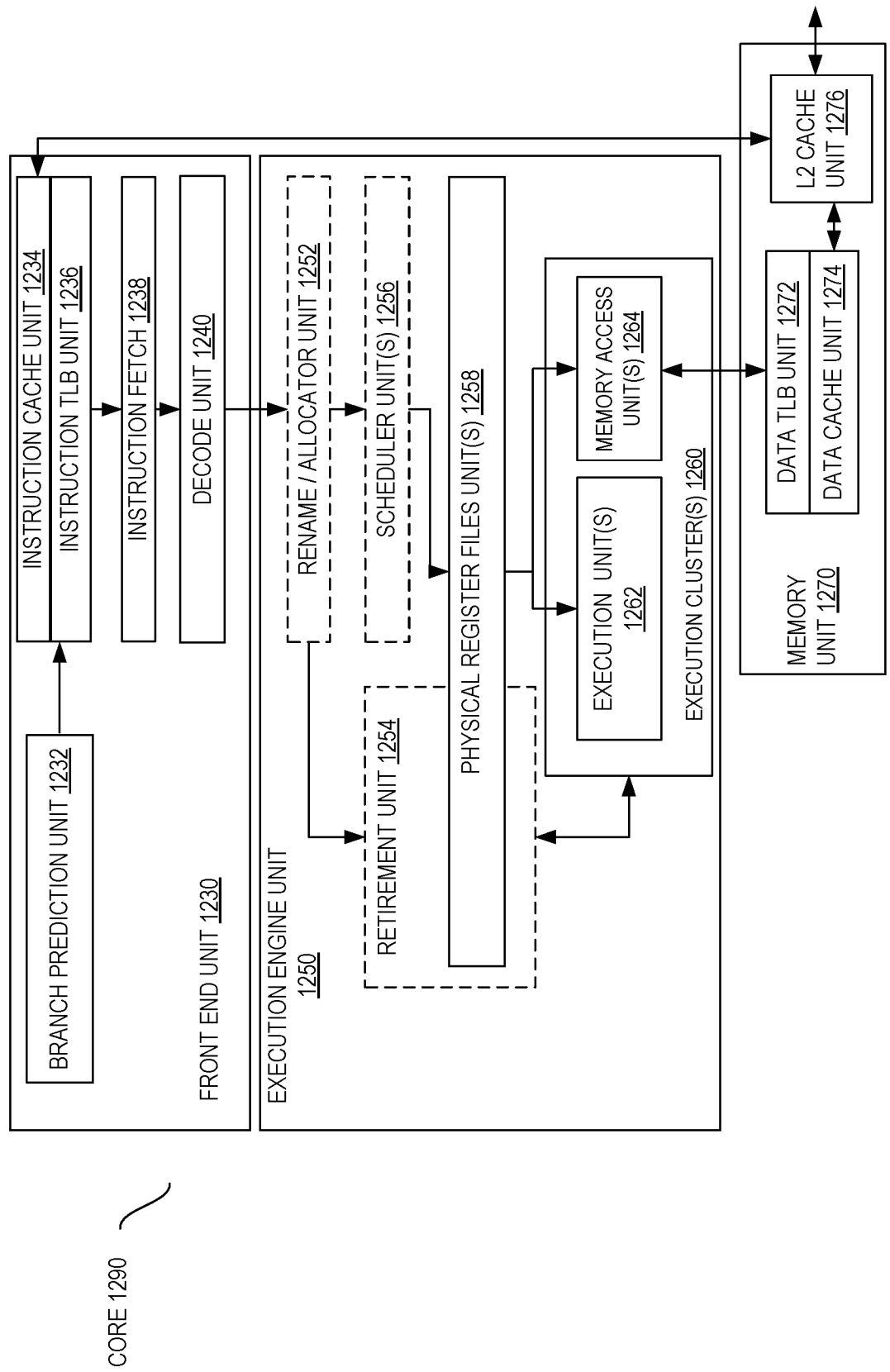
FIG. 12B is a block diagram illustrating both an exemplary embodiment of an in-order architecture core and an exemplary register renaming, out-of-order issue/execution architecture core to be included in a processor according to embodiments of the invention.

FIG. 12A is a block diagram illustrating both an exemplary in-order pipeline and an exemplary register renaming, out-of-order issue/execution pipeline according to embodiments of the invention. FIG. 12B is a block diagram illustrating both an exemplary embodiment of an in-order architecture core and an exemplary register renaming, out-of-order issue/execution architecture core to be included in a processor according to embodiments of the invention. The solid lined boxes in FIGS. 12A and 12B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 12A, a processor pipeline 1200 includes a fetch stage 1202, a length decode stage 1204, a decode stage 1206, an allocation stage 1208, a renaming stage 1210, a scheduling (also known as a dispatch or issue) stage 1212, a register read/memory read stage 1214, an execute stage 1216, a write back/memory write stage 1218, an exception handling stage 1222, and a commit stage 1224.

FIG. 12B shows processor core 1290 including a front end unit 1230 coupled to an execution engine unit 1250, and both are coupled to a memory unit 1270. The core 1290 may be a reduced instruction set computing (RISC) core, a complex instruction set computing (CISC) core, a very long instruction word (VLIW) core, or a hybrid or alternative core type. As yet another option, the core 1290 may be a special-purpose core, such as, for example, a network or communication core, compression engine, coprocessor core, general purpose computing graphics processing unit (GPGPU) core, graphics core, or the like.

The front end unit 1230 includes a branch prediction unit 1232 coupled to an instruction cache unit 1234, which is coupled to an instruction translation lookaside buffer (TLB) 1236, which is coupled to an instruction fetch unit 1238, which is coupled to a decode unit 1240. The decode unit 1240 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1240 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1290 includes a microcode ROM or other medium that stores microcode for certain macroinstructions (e.g., in decode unit 1240 or otherwise within the front end unit 1230). The decode unit 1240 is coupled to a rename/allocator unit 1252 in the execution engine unit 1250.

The execution engine unit 1250 includes the rename/allocator unit 1252 coupled to a retirement unit 1254 and a set of one or more scheduler unit(s) 1256. The scheduler unit(s) 1256 represents any number of different schedulers, including reservations stations, central instruction window, etc. The scheduler unit(s) 1256 is coupled to the physical register file(s) unit(s) 1258. Each of the physical register file(s) units 1258 represents one or more physical register files, different ones of which store one or more different data types, such as scalar integer, scalar floating point, packed integer, packed floating point, vector integer, vector floating point—status (e.g., an instruction pointer that is the address of the next instruction to be executed), etc. In one embodiment, the physical register file(s) unit 1258 comprises a vector registers unit, a write mask registers unit, and a scalar registers unit. These register units may provide architectural vector registers, vector mask registers, and general purpose registers. The physical register file(s) unit(s) 1258 is overlapped by the retirement unit 1254 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1254 and the physical register file(s) unit(s) 1258 are coupled to the execution cluster(s) 1260. The execution cluster(s) 1260 includes a set of one or more execution units 1262 and a set of one or more memory access units 1264. The execution units 1262 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1256, physical register file(s) unit(s) 1258, and execution cluster(s) 1260 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1264). It should also be understood that where separate pipelines are used, one or more of these pipelines may be out-of-order issue/execution and the rest in-order.

The set of memory access units 1264 is coupled to the memory unit 1270, which includes a data TLB unit 1272 coupled to a data cache unit 1274 coupled to a level 2 (L2) cache unit 1276. In one exemplary embodiment, the memory access units 1264 may include a load unit, a store address unit, and a store data unit, each of which is coupled to the data TLB unit 1272 in the memory unit 1270. The instruction cache unit 1234 is further coupled to a level 2 (L2) cache unit 1276 in the memory unit 1270. The L2 cache unit 1276 is coupled to one or more other levels of cache and eventually to a main memory, to enable SRP operations to occur as described herein.

By way of example, the exemplary register renaming, out-of-order issue/execution core architecture may implement the pipeline 1200 as follows: 1) the instruction fetch 1238 performs the fetch and length decoding stages 1202 and 1204; 2) the decode unit 1240 performs the decode stage 1206; 3) the rename/allocator unit 1252 performs the allocation stage 1208 and renaming stage 1210; 4) the scheduler unit(s) 1256 performs the schedule stage 1212; 5) the physical register file(s) unit(s) 1258 and the memory unit 1270 perform the register read/memory read stage 1214; the execution cluster 1260 perform the execute stage 1216; 6) the memory unit 1270 and the physical register file(s) unit(s) 1258 perform the write back/memory write stage 1218; 7) various units may be involved in the exception handling stage 1222; and 8) the retirement unit 1254 and the physical register file(s) unit(s) 1258 perform the commit stage 1224.

The core 1290 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1290 includes logic to support a packed data instruction set extension (e.g., AVX1, AVX2), thereby allowing the operations used by many multimedia applications to be performed using packed data.

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multi-threading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1234/1274 and a shared L2 cache unit 1276, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 13B:
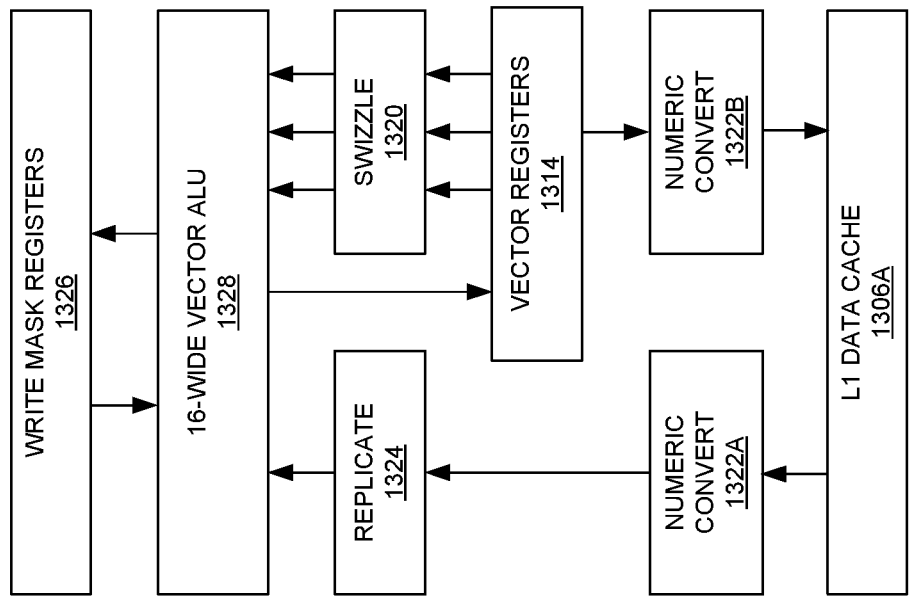
FIGS. 13A and 13B illustrate a block diagram of a more specific exemplary in-order core architecture, which core would be one of several logic blocks (including other cores of the same type and/or different types) in a chip.
Figure 13A:
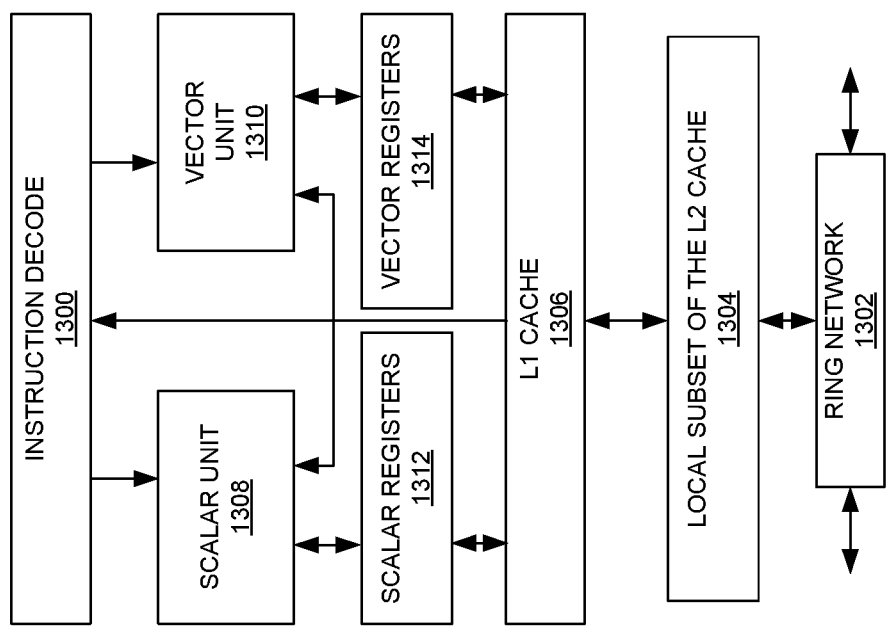

FIGS. 13A and 13B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 13A is a block diagram of a single processor core, along with its connection to the on-die interconnect network 1302 and with its local subset of the Level 2 (L2) cache 1304, according to embodiments of the invention. In one embodiment, an instruction decoder 1300 supports the x86 instruction set with a packed data instruction set extension. An L1 cache 1306 allows low-latency accesses to cache memory into the scalar and vector units. While in one embodiment (to simplify the design), a scalar unit 1308 and a vector unit 1310 use separate register sets (respectively, scalar registers 1312 and vector registers 1314) and data transferred between them is written to memory and then read back in from a level 1 (L1) cache 1306, alternative embodiments of the invention may use a different approach (e.g., use a single register set or include a communication path that allow data to be transferred between the two register files without being written and read back).

The local subset of the L2 cache 1304 is part of a global L2 cache that is divided into separate local subsets, one per processor core. Each processor core has a direct access path to its own local subset of the L2 cache 1304. Data read by a processor core is stored in its L2 cache subset 1304 and can be accessed quickly, in parallel with other processor cores accessing their own local L2 cache subsets. Data written by a processor core is stored in its own L2 cache subset 1304 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 13B is an expanded view of part of the processor core in FIG. 13A according to embodiments of the invention. FIG. 13B includes an L1 data cache 1306A part of the L1 cache 1304, as well as more detail regarding the vector unit 1310 and the vector registers 1314. Specifically, the vector unit 1310 is a 16-wide vector processing unit (VPU) (see the 16-wide ALU 1328), which executes one or more of integer, single-precision float, and double-precision float instructions. The VPU supports swizzling the register inputs with swizzle unit 1320, numeric conversion with numeric convert units 1322A-B, and replication with replication unit 1324 on the memory input. Write mask registers 1326 allow predicating resulting vector writes.

Figure 14:
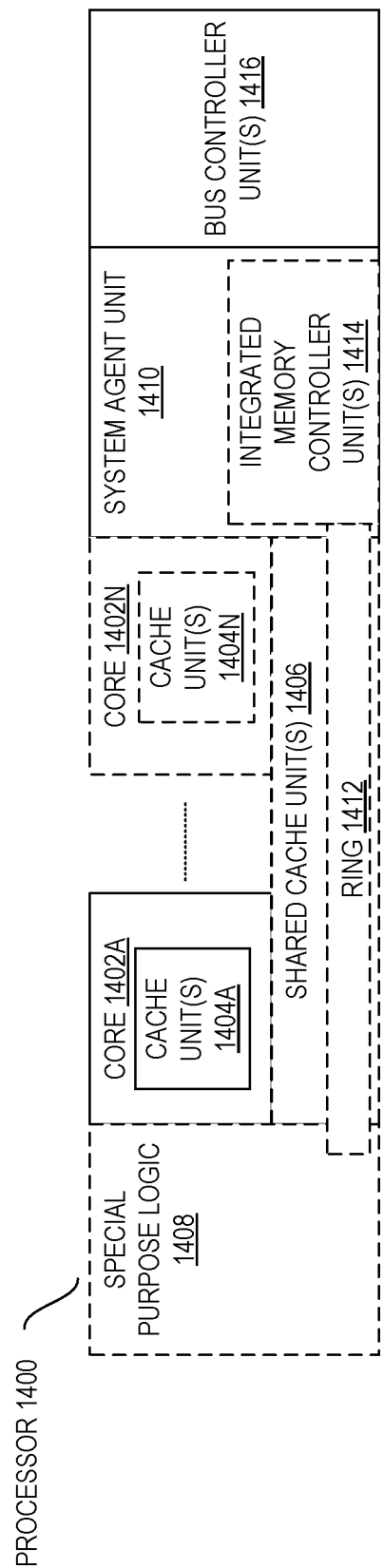
FIG. 14 is a block diagram of a processor that may have more than one core, may have an integrated memory controller, and may have integrated graphics according to embodiments of the invention.

FIG. 14 is a block diagram of a processor 1400 that may have more than one core, may have an integrated memory controller, and may have integrated graphics according to embodiments of the invention. The solid lined boxes in FIG. 14 illustrate a processor 1400 with a single core 1402A, a system agent 1410, a set of one or more bus controller units 1416, while the optional addition of the dashed lined boxes illustrates an alternative processor 1400 with multiple cores 1402A-N, a set of one or more integrated memory controller unit(s) 1414 (which may interact with a memory for performing SRP operations as described herein) in the system agent unit 1410, and special purpose logic 1408.

Thus, different implementations of the processor 1400 may include: 1) a CPU with the special purpose logic 1408 being integrated graphics and/or scientific (throughput) logic (which may include one or more cores), and the cores 1402A-N being one or more general purpose cores (e.g., general purpose in-order cores, general purpose out-of-order cores, a combination of the two); 2) a coprocessor with the cores 1402A-N being a large number of special purpose cores intended primarily for graphics and/or scientific (throughput); and 3) a coprocessor with the cores 1402A-N being a large number of general purpose in-order cores. Thus, the processor 1400 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1400 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1406, and external memory (not shown) coupled to the set of integrated memory controller units 1414. The set of shared cache units 1406 may include one or more mid-level caches, such as level 2 (L2), level 3 (L3), level 4 (L4), or other levels of cache, a last level cache (LLC), and/or combinations thereof. While in one embodiment a ring based interconnect unit 1412 interconnects the special purpose logic 1408, the set of shared cache units 1406, and the system agent unit 1410/integrated memory controller unit(s) 1414, alternative embodiments may use any number of well-known techniques for interconnecting such units. In one embodiment, coherency is maintained between one or more cache units 1406 and cores 1402-A-N.

In some embodiments, one or more of the cores 1402A-N are capable of multithreading. The system agent unit 1410 includes those components coordinating and operating cores 1402A-N. The system agent unit 1410 may include for example a power control unit (PCU) and a display unit. The PCU may be or include logic and components needed for regulating the power state of the cores 1402A-N and the integrated graphics logic 1408. The display unit is for driving one or more externally connected displays.

The cores 1402A-N may be homogenous or heterogeneous in terms of architecture instruction set; that is, two or more of the cores 1402A-N may be capable of execution the same instruction set, while others may be capable of executing only a subset of that instruction set or a different instruction set.

FIGS. 15-18 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 15:
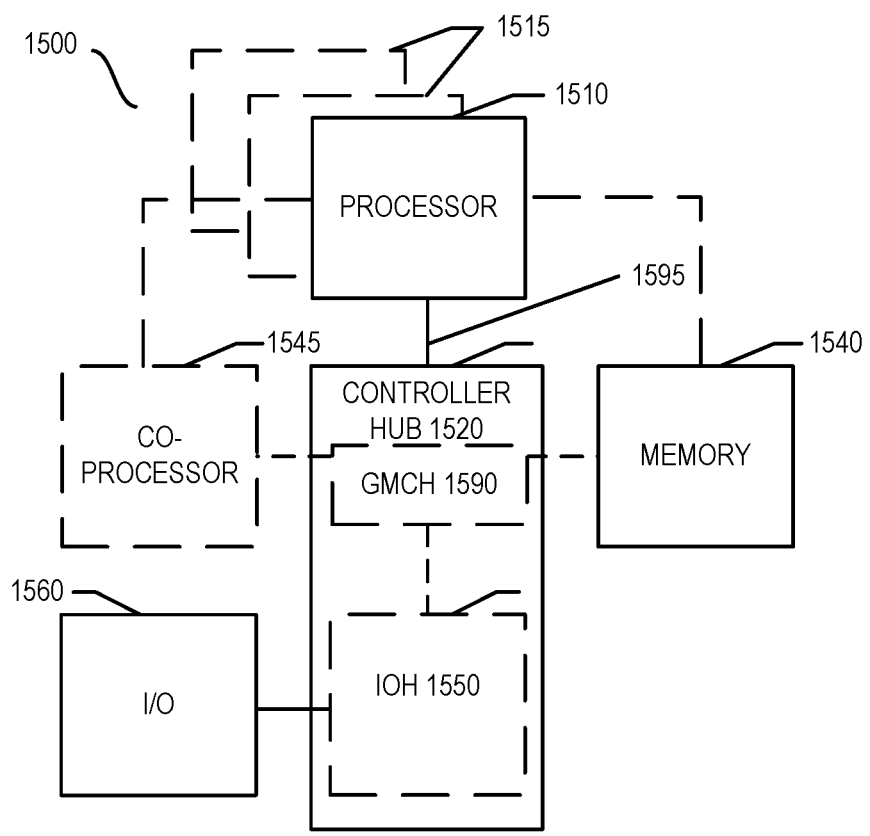
FIG. 15 is a block diagram of a system in accordance with one embodiment of the present invention.

Referring now to FIG. 15, shown is a block diagram of a system 1500 in accordance with one embodiment of the present invention. The system 1500 may include one or more processors 1510, 1515, which are coupled to a controller hub 1520. In one embodiment the controller hub 1520 includes a graphics memory controller hub (GMCH) 1590 and an Input/Output Hub (IOH) 1550 (which may be on separate chips); the GMCH 1590 includes a memory controller to control SRP operations within a coupled memory and a graphics controller to which are coupled memory 1540 and a coprocessor 1545; the IOH 1550 couples input/output (I/O) devices 1560 to the GMCH 1590. Alternatively, one or both of the memory and graphics controllers are integrated within the processor (as described herein), the memory 1540 and the coprocessor 1545 are coupled directly to the processor 1510, and the controller hub 1520 in a single chip with the IOH 1550.

The optional nature of additional processors 1515 is denoted in FIG. 15 with broken lines. Each processor 1510, 1515 may include one or more of the processing cores described herein and may be some version of the processor 1400.

The memory 1540 may be, for example, dynamic random access memory (DRAM), phase change memory (PCM), or a combination of the two. For at least one embodiment, the controller hub 1520 communicates with the processor(s) 1510, 1515 via a multi-drop bus, such as a frontside bus (FSB), point-to-point interface such as QuickPath Interconnect (QPI), or similar connection 1595.

In one embodiment, the coprocessor 1545 is a special-purpose processor, such as, for example, a high-throughput MIC processor, a network or communication processor, compression engine, graphics processor, GPGPU, embedded processor, or the like. In one embodiment, controller hub 1520 may include an integrated graphics accelerator.

There can be a variety of differences between the physical resources 1510, 1515 in terms of a spectrum of metrics of merit including architectural, microarchitectural, thermal, power consumption characteristics, and the like.

In one embodiment, the processor 1510 executes instructions that control data processing operations of a general type. Embedded within the instructions may be coprocessor instructions. The processor 1510 recognizes these coprocessor instructions as being of a type that should be executed by the attached coprocessor 1545. Accordingly, the processor 1510 issues these coprocessor instructions (or control signals representing coprocessor instructions) on a coprocessor bus or other interconnect, to coprocessor 1545. Coprocessor(s) 1545 accept and execute the received coprocessor instructions.

Figure 16:
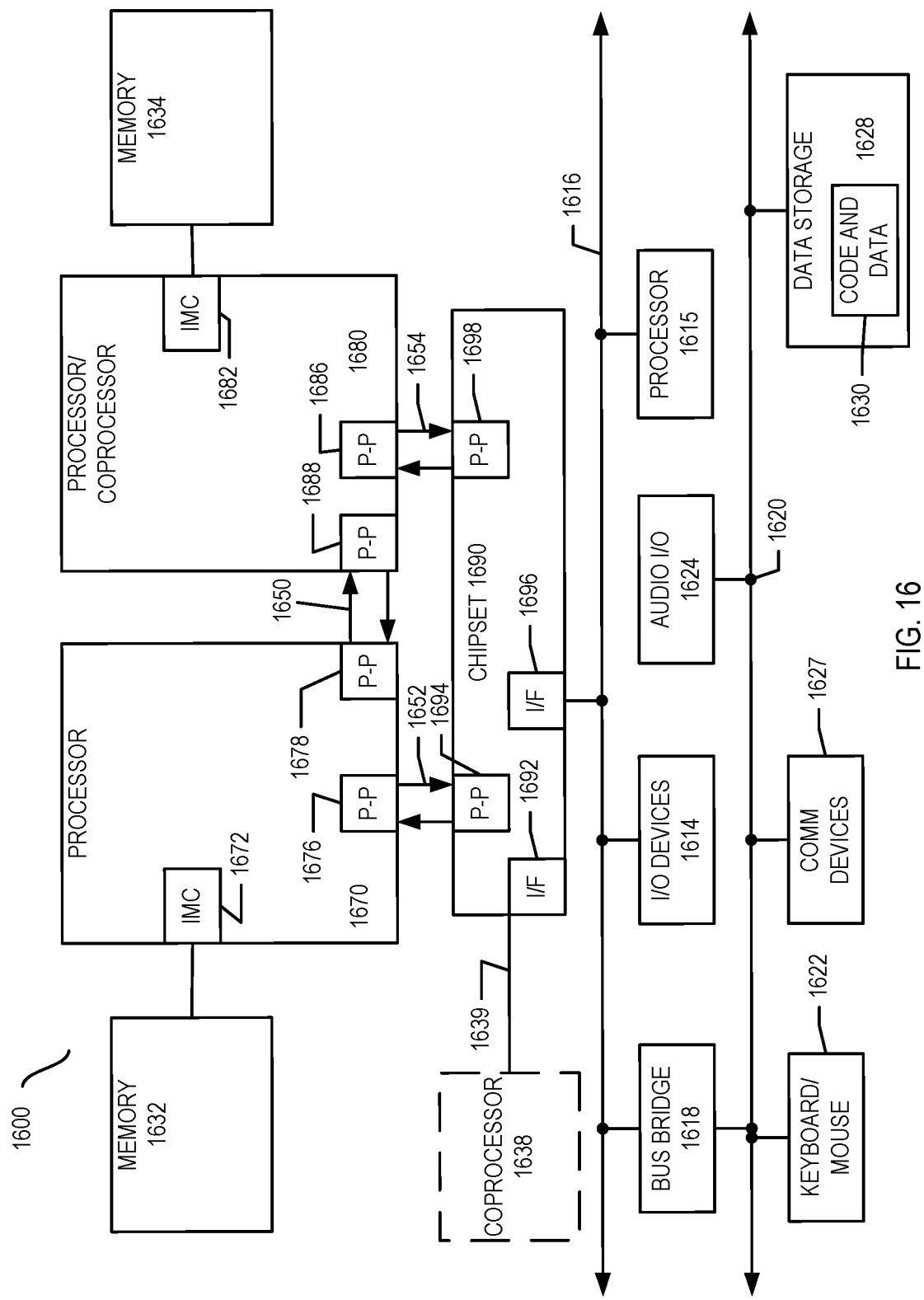
FIG. 16 is a block diagram of a first more specific exemplary system in accordance with an embodiment of the present invention.

Referring now to FIG. 16, shown is a block diagram of a first more specific exemplary system 1600 in accordance with an embodiment of the present invention. As shown in FIG. 16, multiprocessor system 1600 is a point-to-point interconnect system, and includes a first processor 1670 and a second processor 1680 coupled via a point-to-point interconnect 1650. Each of processors 1670 and 1680 may be some version of the processor 1400. In one embodiment of the invention, processors 1770 and 1780 are respectively processors 1510 and 1515, while coprocessor 1638 is coprocessor 1545. In another embodiment, processors 1670 and 1680 are respectively processor 1510 and coprocessor 1545.

Processors 1670 and 1680 are shown including integrated memory controller (IMC) units 1672 and 1682, respectively. Processor 1670 also includes as part of its bus controller units point-to-point (P-P) interfaces 1676 and 1678; similarly, second processor 1680 includes P-P interfaces 1686 and 1688. Processors 1670, 1680 may exchange information via a point-to-point (P-P) interface 1650 using P-P interface circuits 1678, 1688. As shown in FIG. 16, IMCs 1672 and 1682 couple the processors to respective memories, namely a memory 1632 and a memory 1634, which may be portions of main memory locally attached to the respective processors and which may perform SRP operations as described herein.

Processors 1670, 1680 may each exchange information with a chipset 1690 via individual P-P interfaces 1652, 1654 using point to point interface circuits 1676, 1694, 1686, 1698. Chipset 1690 may optionally exchange information with the coprocessor 1638 via a high-performance interface 1639. In one embodiment, the coprocessor 1638 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1690 may be coupled to a first bus 1616 via an interface 1696. In one embodiment, first bus 1616 may be a Peripheral Component Interconnect (PCI) bus, or a bus such as a PCI Express bus or another third generation I/O interconnect bus, although the scope of the present invention is not so limited.

As shown in FIG. 16, various I/O devices 1614 may be coupled to first bus 1616, along with a bus bridge 1618 which couples first bus 1616 to a second bus 1620. In one embodiment, one or more additional processor(s) 1615, such as coprocessors, high-throughput MIC processors, GPGPU's, accelerators (such as, e.g., graphics accelerators or digital signal processing (DSP) units), field programmable gate arrays, or any other processor, are coupled to first bus 1616. In one embodiment, second bus 1620 may be a low pin count (LPC) bus. Various devices may be coupled to a second bus 1620 including, for example, a keyboard and/or mouse 1622, communication devices 1627 and a storage unit 1628 such as a disk drive or other mass storage device which may include instructions/code and data 1630, in one embodiment. Further, an audio I/O 1624 may be coupled to the second bus 1620. Note that other architectures are possible. For example, instead of the point-to-point architecture of FIG. 16, a system may implement a multi-drop bus or other such architecture.

Figure 17:
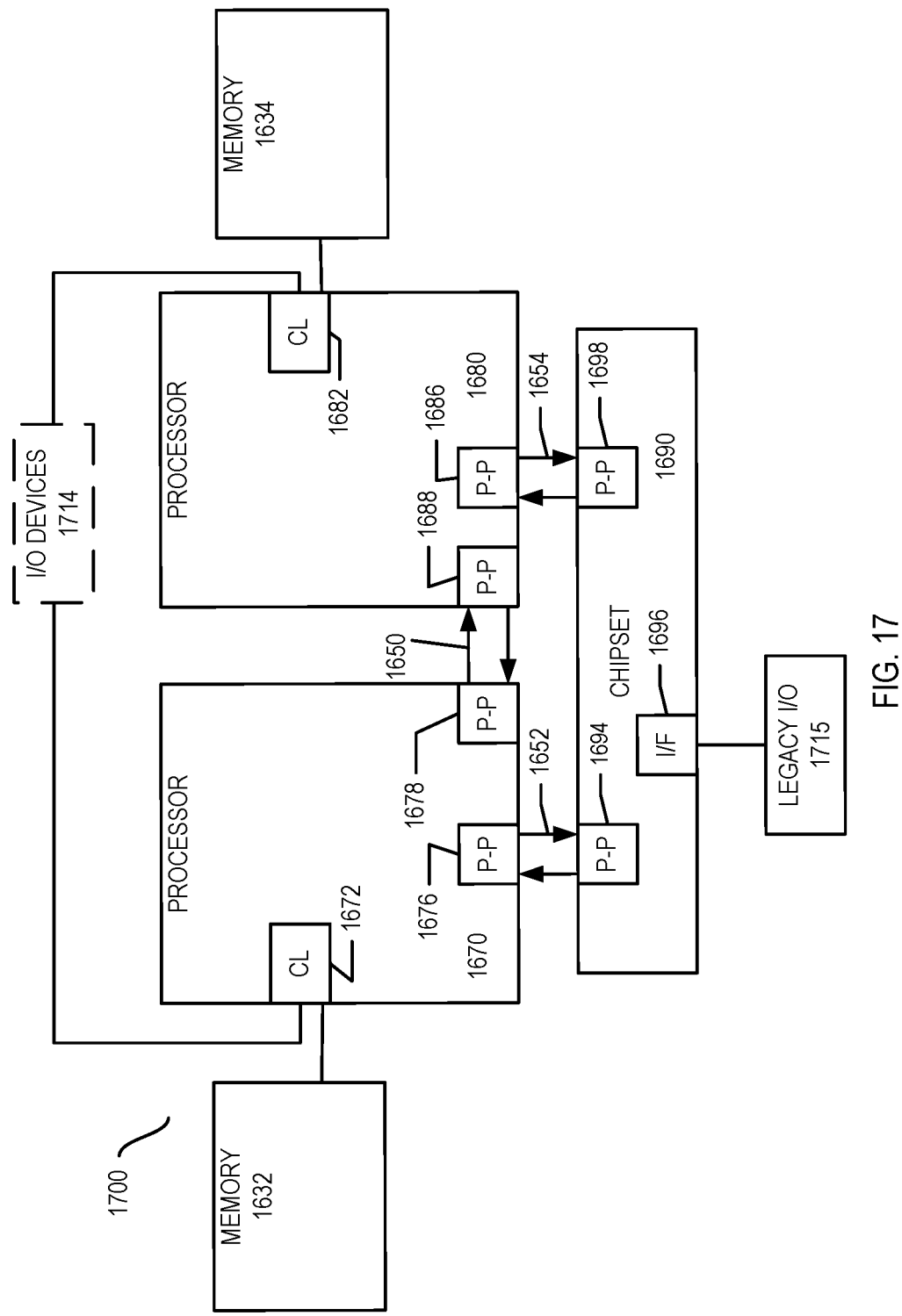
FIG. 17 is a block diagram of a second more specific exemplary system in accordance with an embodiment of the present invention.

Referring now to FIG. 17, shown is a block diagram of a second more specific exemplary system 1700 in accordance with an embodiment of the present invention. Like elements in FIGS. 16 and 17 bear like reference numerals, and certain aspects of FIG. 16 have been omitted from FIG. 17 in order to avoid obscuring other aspects of FIG. 17.

FIG. 17 illustrates that the processors 1670, 1680 may include integrated memory and I/O control logic ("CL") 1672 and 1682, respectively. Thus, the CL 1672, 1682 include integrated memory controller units and include I/O control logic. FIG. 17 illustrates that not only are the memories 1632, 1634 coupled to the CL 1672, 1682, but also that I/O devices 1614 are also coupled to the control logic 1672, 1682. Legacy I/O devices 1615 are coupled to the chipset 1690.

Figure 18:
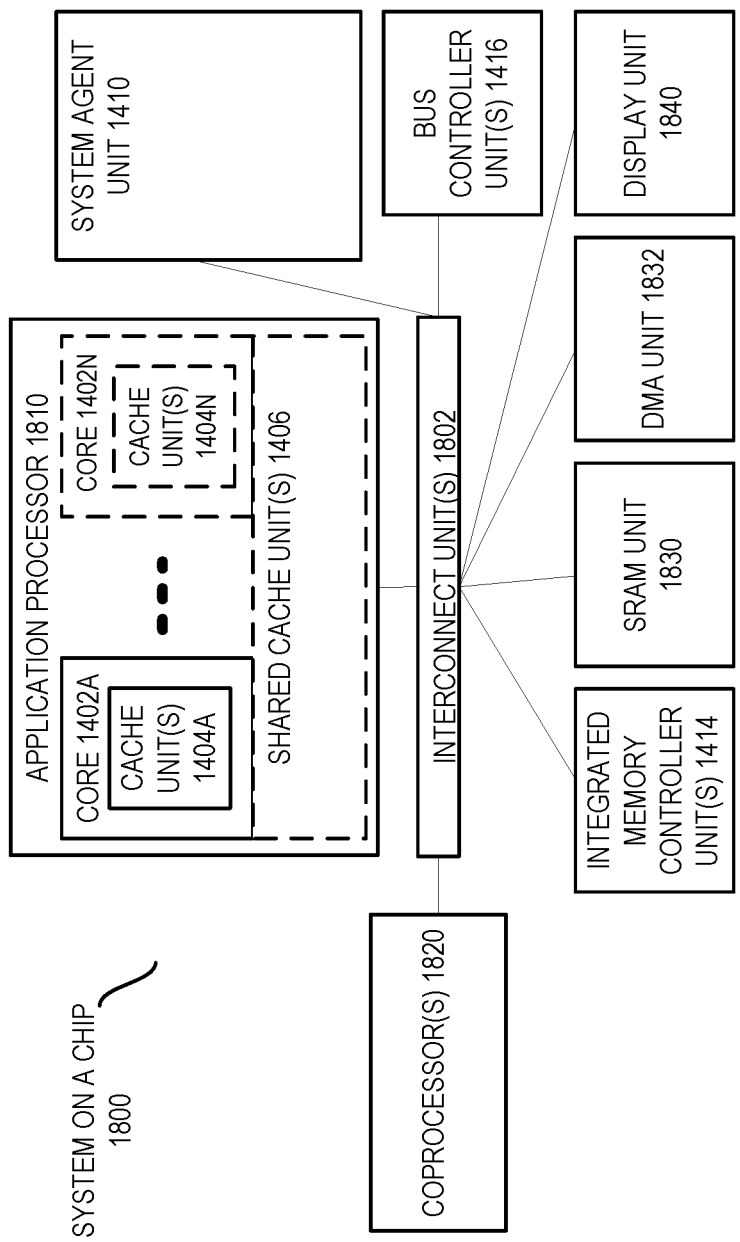
FIG. 18 is a block diagram of a SoC in accordance with an embodiment of the present invention.

Referring now to FIG. 18, shown is a block diagram of a SoC 1800 in accordance with an embodiment of the present invention. Similar elements in FIG. 14 bear like reference numerals. Also, dashed lined boxes are optional features on more advanced SoCs. In FIG. 18, an interconnect unit(s) 1802 is coupled to: an application processor 1810 which includes a set of one or more cores 1402A-N and shared cache unit(s) 1406; a system agent unit 1410; a bus controller unit(s) 1416; an integrated memory controller unit(s) 1414; a set or one or more coprocessors 1820 which may include integrated graphics logic, an image processor, an audio processor, and a video processor; an static random access memory (SRAM) unit 1830; a direct memory access (DMA) unit 1832; and a display unit 1840 for coupling to one or more external displays. In one embodiment, the coprocessor(s) 1820 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1630 illustrated in FIG. 16, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 19:
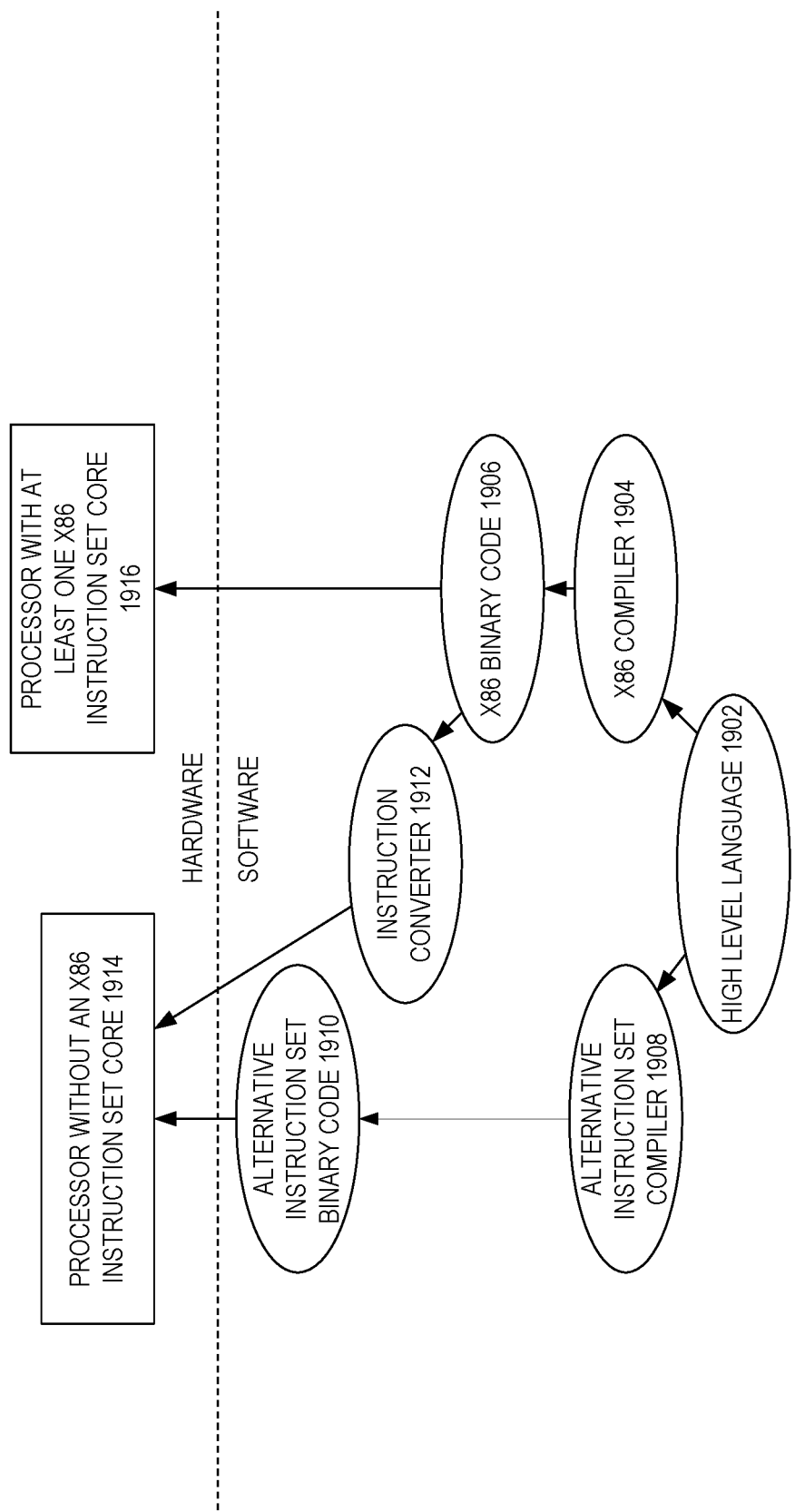
FIG. 19 is a block diagram contrasting the use of a software instruction converter to convert binary instructions in a source instruction set to binary instructions in a target instruction set according to embodiments of the invention.

FIG. 19 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 19 shows a program in a high level language 1902 may be compiled using an x86 compiler 1904 to generate x86 binary code 1906 that may be natively executed by a processor with at least one x86 instruction set core 1916. The processor with at least one x86 instruction set core 1916 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1904 represents a compiler that is operable to generate x86 binary code 1906 (e.g., object code) that can, with or without additional linkage processing, be executed on the processor with at least one x86 instruction set core 1916. Similarly, FIG. 19 shows the program in the high level language 1902 may be compiled using an alternative instruction set compiler 1908 to generate alternative instruction set binary code 1910 that may be natively executed by a processor without at least one x86 instruction set core 1914 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1912 is used to convert the x86 binary code 1906 into code that may be natively executed by the processor without an x86 instruction set core 1914. This converted code is not likely to be the same as the alternative instruction set binary code 1910 because an instruction converter capable of this is difficult to make; however, the converted code will accomplish the general operation and be made up of instructions from the alternative instruction set. Thus, the instruction converter 1912 represents software, firmware, hardware, or a combination thereof that, through emulation, simulation or any other process, allows a processor or other electronic device that does not have an x86 instruction set processor or core to execute the x86 binary code 1906.

The following examples pertain to further embodiments.

In one example, an apparatus comprises: a memory array having a plurality of memory cells, a plurality of bitlines coupled to the plurality of memory cells, and a plurality of wordlines coupled to the plurality of memory cells; and a sense amplifier circuit to sense and amplify a value stored in a memory cell of the plurality of memory cells. The sense amplifier circuit may include: a buffer circuit to store the value, the buffer circuit coupled between a first internal node of the sense amplifier circuit and a second internal node of the sense amplifier circuit; and an equalization circuit to equalize the first internal node and the second internal node while the sense amplifier circuit is decoupled from the memory array.

In an example, the equalization circuit is to be enabled during a charge sharing phase of an activate operation.

In an example, the apparatus further comprises an isolation circuit to controllably couple and decouple the sense amplifier circuit with respect to the memory array.

In an example, the apparatus further comprises a precharge circuit coupled to the memory array to precharge the plurality of bitlines.

In an example, the precharge circuit is to precharge the plurality of bitlines while information stored in the sense amplifier circuit is to be read.

In an example, the isolation circuit is to decouple the sense amplifier circuit from the memory array prior to the precharge of the plurality of bitlines by the precharge circuit, the isolation circuit including one or more transistors switchably controlled to decouple the sense amplifier circuit from the memory array, where the one or more transistors are sized having a length substantially greater than a width to enable a medium on resistance.

In an example, the equalization circuit comprises: a first transistor coupled between the first internal node and the second internal node, the first transistor to couple the first internal node and the second internal node based on a second state of a sense enable signal; and a second transistor coupled between the first internal node and the second internal node, the second transistor to couple the first internal node and the second internal node based on a first state of a complementary sense enable signal.

In an example, a first state of the sense enable signal is to enable the sense amplifier circuit to be accessed.

In an example, the apparatus further comprises a memory controller coupled to the memory array, where the memory controller, in response to a read request, is to: issue a combined activate and precharge command to the memory array; and thereafter issue a plurality of read requests to the memory array.

In an example, the memory array is to return a plurality of data responses for the plurality of read requests, where at least some of the plurality of data responses are to be sent during a precharge of the plurality of bitlines in response to the combined activate and precharge command.

In an example, the apparatus further comprises a memory controller coupled to the memory array, where the memory controller, in response to a write request, is to: issue an activate command to the memory array; thereafter issue one or more write requests to the memory array; and thereafter issue a precharge command to the memory array.

In another example, a method comprises receiving, in a memory controller, a memory access request; determining a time duration from a last activate operation to a row of a memory coupled to the memory controller to receiving the memory access request; updating an open time table of the memory controller based on the time duration; calculating histogram information for a plurality of entries of the open time table; identifying an open duration for a sense amplifier of the memory based at least in part on the histogram information and a hit threshold; and causing the memory to close the sense amplifier after the open duration.

In an example, the method further comprises: during a first program phase, causing the memory to close the sense amplifier after a first open duration; and during a second program phase, causing the memory to close the sense amplifier after a second open duration, the second open duration different than the first open duration.

In an example, the histogram information comprises a plurality of fractional hit rates for a plurality of open durations.

In an example, the method further comprises identifying the open duration obtained from an entry of the plurality of entries having a minimal fractional hit rate that exceeds the hit threshold.

In another example, a computer readable medium including instructions is to perform the method of any of the above examples.

In another example, a computer readable medium including data is to be used by at least one machine to fabricate at least one integrated circuit to perform the method of any one of the above examples.

In another example, an apparatus comprises means for performing the method of any one of the above examples.

In another example, a system comprises: a processor including at least one core and a memory controller to interface the processor to a memory, and the memory coupled to the processor. The memory may include: a memory array having a plurality of memory cells, a plurality of bitlines coupled to the plurality of memory cells, and a plurality of wordlines coupled to the plurality of memory cells; and a sense amplifier circuit to sense and amplify a value stored in a memory cell of the plurality of memory cells. The sense amplifier circuit may include: a buffer circuit to store the value, the buffer circuit coupled between a first internal node to be controllably coupled to a first bitline of the plurality of bitlines and a second internal node to be controllably coupled to a second bitline of the plurality of bitlines; and an equalization circuit to equalize the first internal node and the second internal node during a charge sharing phase of an activate operation of the memory array in response to an activate command from the memory controller.

In an example, the memory controller is to issue the activate command as a combined activate and precharge command when there are no pending write requests to a first row of the memory array.

In an example, the memory controller is to issue a precharge command to the memory after a restoration duration following the activate command, and where the memory further comprises a precharge circuit coupled to the memory array to precharge the plurality of bitlines in response to the precharge command, the sense amplifier circuit to be decoupled from the first bitline and the second bitline during the precharge of the plurality of bitlines.

In an example, the memory further comprises an isolation circuit to decouple the sense amplifier circuit from the first bitline and the second bitline at least during the precharge of the plurality of bitlines.

In an example, the sense amplifier circuit is to provide read data to the processor during the precharge of the plurality of bitlines.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a memory array having a plurality of memory cells, a plurality of bitlines coupled to the plurality of memory cells, and a plurality of wordlines coupled to the plurality of memory cells; and
   a sense amplifier circuit to sense and amplify a value stored in a memory cell of the plurality of memory cells, the sense amplifier circuit including:
      a buffer circuit to store the value, the buffer circuit coupled between a first internal node of the sense amplifier circuit and a second internal node of the sense amplifier circuit, the first and second internal nodes separate from a first bitline coupled to the memory cell; and
      an equalization circuit to equalize the first internal node and the second internal node while the sense amplifier circuit is decoupled from the memory array.

2. The apparatus of claim 1, wherein the equalization circuit is to be enabled during a charge sharing phase of an activate operation.

3. The apparatus of claim 1, further comprising an isolation circuit to controllably couple and decouple the sense amplifier circuit with respect to the memory array.

4. The apparatus of claim 3, further comprising a precharge circuit coupled to the memory array to precharge the plurality of bitlines.

5. The apparatus of claim 4, wherein the precharge circuit is to precharge the plurality of bitlines while information stored in the sense amplifier circuit is to be read.

6. The apparatus of claim 5, wherein the isolation circuit is to decouple the sense amplifier circuit from the memory array prior to the precharge of the plurality of bitlines by the precharge circuit, the isolation circuit including one or more transistors switchably controlled to decouple the sense amplifier circuit from the memory array, wherein the one or more transistors are sized having a length substantially greater than a width to enable a medium on resistance.

7. The apparatus of claim 1, wherein the equalization circuit comprises:
   a first transistor coupled between the first internal node and the second internal node, the first transistor to couple the first internal node and the second internal node based on a second state of a sense enable signal; and
   a second transistor coupled between the first internal node and the second internal node, the second transistor to couple the first internal node and the second internal node based on a first state of a complementary sense enable signal.

8. The apparatus of claim 7, wherein a first state of the sense enable signal is to enable the sense amplifier circuit to be accessed.

9. The apparatus of claim 1, further comprising a memory controller coupled to the memory array, wherein the memory controller, in response to a read request, is to:
   issue a combined activate and precharge command to the memory array; and
   thereafter issue a plurality of read requests to the memory array.

10. The apparatus of claim 9, wherein the memory array is to return a plurality of data responses for the plurality of read requests, wherein at least some of the plurality of data responses are to be sent during a precharge of the plurality of bitlines in response to the combined activate and precharge command.

11. The apparatus of claim 1, further comprising a memory controller coupled to the memory array, wherein the memory controller, in response to a write request, is to:
   issue an activate command to the memory array;
   thereafter issue one or more write requests to the memory array; and
   thereafter issue a precharge command to the memory array.

12. At least one computer readable storage medium having stored thereon instructions, which if performed by a machine cause the machine to perform a method comprising:
   receiving, in a memory controller, a memory access request;
   determining a time duration from a last activate operation to a row of a memory coupled to the memory controller to receiving the memory access request;
   updating an open time table of the memory controller based on the time duration;
   calculating histogram information for a plurality of entries of the open time table;
   identifying an open duration for a sense amplifier of the memory based at least in part on the histogram information and a hit threshold; and
   causing the memory to close the sense amplifier after the open duration.

13. The at least one computer readable storage medium of claim 12, wherein the method further comprises:
   during a first program phase, causing the memory to close the sense amplifier after a first open duration; and
   during a second program phase, causing the memory to close the sense amplifier after a second open duration, the second open duration different than the first open duration.

14. The at least one computer readable storage medium of claim 12, wherein the histogram information comprises a plurality of fractional hit rates for a plurality of open durations.

15. The at least one computer readable storage medium of claim 14, wherein the method further comprises identifying the open duration obtained from an entry of the plurality of entries having a minimal fractional hit rate that exceeds the hit threshold.

16. A system comprising:
   a processor including at least one core and a memory controller to interface the processor to a memory; and the memory coupled to the processor, the memory comprising:
 a memory array having a plurality of memory cells, a plurality of bitlines coupled to the plurality of memory cells, and a plurality of wordlines coupled to the plurality of memory cells; and
 a sense amplifier circuit to sense and amplify a value stored in a memory cell of the plurality of memory cells, the sense amplifier circuit including:
  a buffer circuit to store the value, the buffer circuit coupled between a first internal node to be controllably coupled to a first bitline of the plurality of bitlines and a second internal node to be controllably coupled to a second bitline of the plurality of bitlines; and
  an equalization circuit to equalize the first internal node and the second internal node during a charge sharing phase of an activate operation of the memory array in response to an activate command from the memory controller.

17. The system of claim 16, wherein the memory controller is to issue the activate command as a combined activate and precharge command when there are no pending write requests to a first row of the memory array.

18. The system of claim 16, wherein the memory controller is to issue a precharge command to the memory after a restoration duration following the activate command, and wherein the memory further comprises a precharge circuit coupled to the memory array to precharge the plurality of bitlines in response to the precharge command, the sense amplifier circuit to be decoupled from the first bitline and the second bitline during the precharge of the plurality of bitlines.

19. The system of claim 18, wherein the sense amplifier circuit is to provide read data to the processor during the precharge of the plurality of bitlines.

20. The system of claim 16, wherein the equalization circuit comprises:
 a first transistor coupled between the first internal node and the second internal node, the first transistor to couple the first internal node and the second internal node based on a second state of a sense enable signal; and
 a second transistor coupled between the first internal node and the second internal node, the second transistor to couple the first internal node and the second internal node based on a first state of a complementary sense enable signal.

* * * * *